(12) United States Patent
Guler et al.

(10) Patent No.: US 12,457,778 B2
(45) Date of Patent: Oct. 28, 2025

(54) CONDUCTIVE CONTACTS WRAPPED AROUND EPITAXIAL SOURCE OR DRAIN REGIONS

(71) Applicant: Intel Corporation, Santa Clara, CA (US)

(72) Inventors: Leonard P. Guler, Hillsboro, OR (US); Gilbert Dewey, Beaverton, OR (US); Saurabh Morarka, Portland, OR (US); Sikandar Abbas, Forest Grove, OR (US); Mohammad Hasan, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 17/681,263

(22) Filed: Feb. 25, 2022

(65) Prior Publication Data

US 2023/0275124 A1  Aug. 31, 2023

(51) Int. Cl.
*H01L 29/06* (2006.01)
*H01L 27/088* (2006.01)
(Continued)

(52) U.S. Cl.
CPC ........ *H10D 62/121* (2025.01); *H10D 30/6713* (2025.01); *H10D 30/6735* (2025.01); *H10D 30/6757* (2025.01); *H10D 84/83* (2025.01)

(58) Field of Classification Search
CPC ............. H10D 62/121; H10D 30/6713; H10D 30/6735; H10D 30/6757; H10D 84/83; H10D 30/014; H10D 30/0198; H10D 30/43; H10D 62/364; H10D 62/151; H10D 64/017; H10D 64/251; H10D 84/0149; H10D 84/0151; H10D 84/038;
(Continued)

(56) References Cited

U.S. PATENT DOCUMENTS 9,847,390 B1  12/2017  Xie et al.
10,236,292 B1  3/2019  Frougier et al.
(Continued)

OTHER PUBLICATIONS

Extended European Search Report received for EP Application No. 23151867.1, dated Jul. 4, 2023. 12 pages.
(Continued)

*Primary Examiner* — Tong-Ho Kim
(74) *Attorney, Agent, or Firm* — Finch & Maloney PLLC

(57) ABSTRACT

Techniques are provided herein to form semiconductor devices having epitaxial diffusion regions (e.g., source and/or drain regions) wrapped by a conductive contact. In an example, a semiconductor device includes a source or drain region and a conductive layer that extends around the source or drain region such that the conductive layer at least contacts the sidewalls of the source or drain region or wraps completely around the source or drain region. In some examples, a conducive contact extends upward through a thickness of an adjacent dielectric layer and contacts the conductive layer from below, thus forming a backside contact. By forming a conductive layer around multiple sides of the source or drain region (rather than just contacting a top or bottom surface) more surface area of the source or drain region is contacted thus providing an improved ohmic contact and a lower overall contact resistance.

20 Claims, 18 Drawing Sheets

(51) Int. Cl.
  *H01L 29/423* (2006.01)
  *H01L 29/786* (2006.01)
  *H10D 30/67* (2025.01)
  *H10D 62/10* (2025.01)
  *H10D 84/83* (2025.01)

(58) Field of Classification Search
  CPC ......... H01L 21/76895; H01L 21/76897; H01L 21/76898; H01L 23/485; B82Y 10/00
  USPC ........................................................ 257/288
  See application file for complete search history.

(56) References Cited

U.S. PATENT DOCUMENTS

2021/0257452 A1  8/2021  Trivedi et al.
2021/0343645 A1* 11/2021  Peng .................. H10D 84/0149
2021/0408246 A1* 12/2021  Ganguly ........... H01L 21/02532

OTHER PUBLICATIONS

Jegadheesan, V. and Sivasankaran, K., "A source/drain-on-insulator structure to improve the performance of stacked nanosheet field-effect transistors" Journal of Computational Electronics (Apr. 25, 2020) vol. 19., No. 3. pp. 1136-1143.
Kang, et al., "Investigation of Self-Heating Effects in Vertically Stacked GAA MOSFET With Wrap-Around Contact," IEEE Transactions on Electron Devices (Mar. 2022) vol. 69, p. No. 3. pp. 910-914.
Song, et al., "System Design Technology Co-Optimization for 3D Integration at <5nm nodes," IEEE International Electron Devices Meeting (IEDM) (Dec. 11, 2021) pp. 494-497.

* cited by examiner

CONDUCTIVE CONTACTS WRAPPED AROUND EPITAXIAL SOURCE OR DRAIN REGIONS

FIELD OF THE DISCLOSURE

The present disclosure relates to integrated circuits, and more particularly, to the epitaxial region contact formation for transistor devices.

BACKGROUND

As integrated circuits continue to scale downward in size, a number of challenges arise. For instance, reducing the size of memory and logic cells is becoming increasingly more difficult. Providing contacts to the various transistor structures presents a challenge as the devices continue to scale downward. Having a good ohmic contact to the source or drain regions of a device is important for a robust operation, yet providing a good ohmic contact to each source or drain region across an integrated circuit can be difficult. Accordingly, there remain a number of non-trivial challenges with respect to semiconductor source or drain contact formation.

Figure 1:
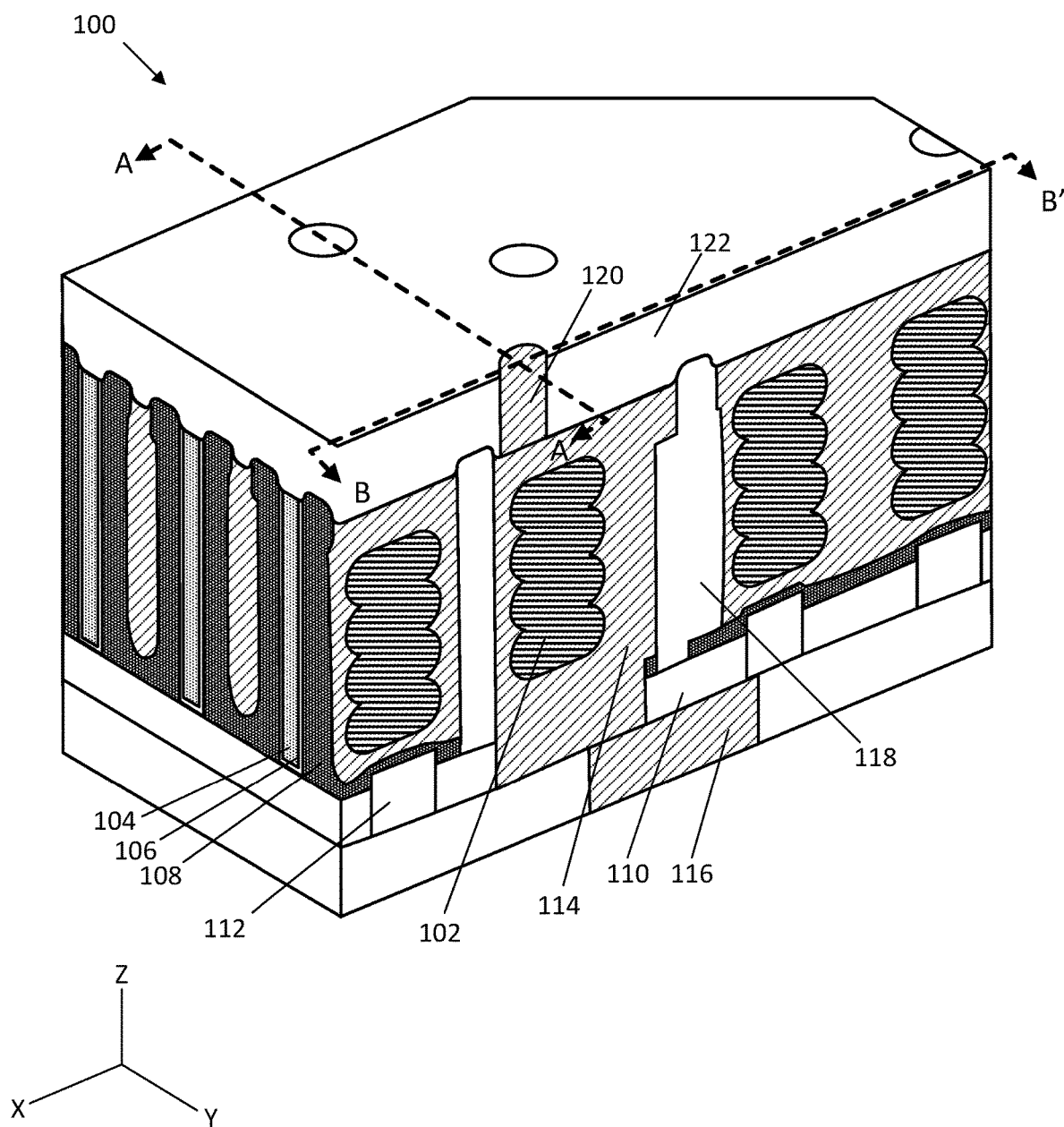
FIG. 1 is an isometric view of an integrated circuit structure that includes epitaxial regions wrapped by conductive contacts, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices having one or more epitaxial source or drain regions wrapped by a conductive contact to form an improved ohmic contact. A backside contact may also be formed to facilitate connection with backside power rails and/or other backside signal layers. The techniques can be used in any number of integrated circuit applications and are particularly useful with respect to logic and memory cells, such as those cells that use finFETs or gate-all-around transistors. In an example, a first semiconductor device includes a first semiconductor region, such as one or more first nanoribbons, extending between a first source or drain region and a second source or drain region, and a second semiconductor device includes a second semiconductor region, such as one or more second nanoribbons, extending between the first source or drain region and a third source or drain region. Each of the first and second semiconductor devices also include subfin regions adjacent to a dielectric layer that extends between the first and second semiconductor devices. A conductive layer extends around the first source or drain region such that the conductive layer at least contacts the sidewalls of the first source or drain region. In some embodiments, a conducive contact extends through a thickness of the dielectric layer and contacts the conductive layer from below, thus forming a backside contact. By forming a conductive layer around multiple sides of the source or drain region (rather than just contacting a top or bottom surface) more surface area of the source or drain region is contacted thus providing an improved ohmic contact and a lower overall contact resistance. Numerous variations and embodiments will be apparent in light of this disclosure.

General Overview

As previously noted above, there remain a number of non-trivial challenges with respect to epitaxial contact formation. Epitaxial contacts may be formed along the top surface of the source or drain regions for frontside contacts or formed on the bottom surface of the source or drain regions for backside contacts. However, such contacts do not leverage the total surface area present along the entire outside surface of the source or drain regions, especially along the sidewalls of the epitaxially grown regions. Furthermore, due to the mechanics of the epitaxial growth, the sidewalls portions of the source or drain regions tend to be rough or otherwise have topography, thus having a larger surface area to provide a better ohmic contact.

Thus, and in accordance with an embodiment of the present disclosure, techniques are provided herein to form epitaxial contact structures that provide a better ohmic contact with a lower overall contact resistance to the source and/or drain regions, or other epitaxial diffusion region(s). The contacts are formed in such a way that they wrap around the source or drain regions, thus contacting the sidewalls to provide an enhanced ohmic contact. The epitaxial source or drain region may also include a highly conductive outer layer, such as a silicide layer, to provide a better ohmic contact with the conductive material (e.g., a metal) of the contact. The metal contact may extend along all surfaces of a source or drain region such that the contact wraps completely around the source or drain region or at least wraps around the sidewalls of the source or drain region. As used herein, the term "along" means that a structure is closely adjacent to (e.g., within 20 nm of) and runs in the same direction (e.g., parallel to) another structure. For example, a layer that is along a sidewall of a gate runs in the same direction to the gate sidewall and is within 20 nm of the sidewall of the gate. Additionally, a layer can be along a structure without being directly on the structure such that one or more intervening layers could exist between the layer and the structure.

According to an embodiment, an integrated circuit includes a first semiconductor device having a subfin and one or more first semiconductor bodies extending in a first direction between a first source or drain region and a second source or drain region, and a second semiconductor device having the subfin and one or more second semiconductor bodies extending in the first direction between the first source or drain region and a third source or drain region. The integrated circuit further includes a dielectric layer adjacent to the subfin of the first semiconductor device and the second semiconductor device, a conductive layer that extends completely around the first source or drain region between the one or more first semiconductor bodies and the one or more second semiconductor bodies, and a conductive contact extending through a thickness of the dielectric layer and contacting the conductive layer from below the first source or drain region. The one or more first semiconductor bodies and the one or more second semiconductor bodies may include one or more nanoribbons, nanowires, or nanosheets.

According to another embodiment, an integrated circuit includes a first semiconductor device having one or more first semiconductor regions extending in a first direction between a first source or drain region and a second source or drain region, and a second semiconductor device having one or more second semiconductor regions extending in the first direction between the first source or drain region and a third source or drain region. The integrated circuit further includes a conductive layer that extends completely around the first source or drain region between the one or more first semiconductor regions and the one or more second semiconductor regions.

According to another embodiment, a method of forming an integrated circuit includes forming a multilayer fin extending in a first direction over a substrate having a first section with first material layers alternating with second material layers, and a subfin section beneath the first section; forming a dielectric layer adjacent to the subfin section; forming a sacrificial gate and spacers on sidewalls of the sacrificial gate, the sacrificial gate extending in a second direction over the multilayer fin, the second direction being different from the first direction; removing an exposed portion of the multilayer fin adjacent to the sacrificial gate and etching a recess through a thickness of the dielectric layer; forming a first sacrificial material within the recess; forming a source or drain region over the sacrificial material and coupled to ends of the second material layers; forming a second sacrificial material completely around the source or drain region; forming one or more dielectric plugs through the second sacrificial material; and replacing the first sacrificial material and the second sacrificial material with a conductive material. In some embodiments, the first sacrificial material and second sacrificial material are replaced separately with first and second conductive materials having a visible interface between the first and second conductive materials.

The techniques can be used with any type of non-planar transistors, including finFETs (sometimes called double-gate transistors, or tri-gate transistors), or nanowire, nanosheet, and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The source and drain regions may be any epitaxial diffusion region. The gate structure can be implemented with a gate-first process or a gate-last process (sometimes called a remove metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of a conductive contact material around multiple sides of a diffusion region (e.g., source or drain region), such as at least along the sidewalls of the diffusion region. In some embodiments, the conductive contact material completely wraps around the diffusion region. A backside contact may also be observed, such as a backside contact beneath a given source or drain region that is wider than the diffusion region. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

FIG. 1 is an isometric view of a portion of an integrated circuit 100 that includes various parallel semiconductor devices, in accordance with an embodiment of the present disclosure. Each of the semiconductor devices may be non-planar metal oxide semiconductor (MOS) transistors, such as tri-gate or gate-all-around transistors, although other transistor topologies and types could also benefit from the techniques provided herein. The examples herein illustrate semiconductor devices with a GAA structure (e.g., having nanoribbons, nanowires, or nanosheets that extend between source and drain regions).

Each semiconductor device includes one or more semiconductor regions, such as one or more nanoribbons extending between epitaxial source or drain regions 102 in a first direction along the Y-axis. A gate structure that includes a gate electrode 104 and a gate dielectric layer 104 extend over the one or more semiconductor regions in a second direction (e.g. along the X-axis) to form the transistor gate. A given gate structure may extend over the semiconductor regions of more than one semiconductor device. It should be noted that the one or more semiconductor regions of each device are not shown in the isometric view of FIG. 1 as they are covered by other material layers.

The semiconductor material used in each of the semiconductor devices may be formed from a semiconductor substrate, which has been removed in the illustrated final device using a backside process that will be discussed in more detail herein. The one or more semiconductor regions of the devices may include fins that can be, for example, native to the substrate (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around process can then be carried out. Again, the alternating layers can be blanket deposited and then etched into fins or deposited into fin-shaped trenches.

Source or drain regions 102 may be formed at the ends of the one or more semiconductor regions of each device, and thus may be aligned along the second direction from one another. According to some embodiments, source or drain regions 102 are epitaxial regions that are provided on the semiconductor regions in an etch-and-replace process. In other embodiments source or drain regions 102 could be, for example, implantation-doped native portions of the fins or substrate. Any semiconductor materials suitable for source or drain regions can be used (e.g., group IV and group III-V semiconductor materials). Source or drain regions 102 may include multiple layers such as liners and capping layers to improve contact resistance. In any such cases, the composition and doping of source or drain regions 102 may be the same or different, depending on the polarity of the transistors. Any number of source or drain configurations and materials can be used.

In some embodiments, a conductive liner may be present along the outer surface of source or drain regions 102, such that the conductive liner is present between source or drain region 102 and conductive layer 114. The conductive liner may be a silicide or other highly conductive material, and may be used to further reduce the contact resistance between source or drain region 102 and conductive layer 114.

As noted above, a gate structure extends in the second direction over the one or more semiconductor regions of various devices and includes both gate electrode 104 and gate dielectric 106. Gate electrode 104 may include any sufficiently conductive material such as a metal, metal alloy, or doped polysilicon. In some embodiments, gate electrode 104 includes one or more workfunction metals around the one or more semiconductor regions. In some embodiments, p-channel devices include a workfunction metal having titanium around its one or more semiconductor regions and n-channel devices include a workfunction metal having tungsten around its one or more semiconductor regions. Gate electrode 104 may also include a fill metal or other conductive material around the workfunction metals to provide the whole gate electrode structure. Gate dielectric 106 represents any number of dielectric layers that exist between the one or more semiconductor regions and gate electrode 104.

According to some embodiments, spacer structures 108 are present on the sidewalls of the gate structure and define a gate trench through which the gate structure is formed. Spacer structures 108 may include a suitable dielectric material such as silicon nitride or silicon oxynitride.

As can further be seen, a dielectric layer 110 extends across a bottom portion of the integrated circuit and between subfins 112 of each of the semiconductor devices, according to an embodiment. Dielectric layer 110 may include any suitable dielectric material such as silicon oxide. Dielectric layer 110 provides shallow trench isolation (STI) between adjacent semiconductor devices. According to some embodiments, subfins 112 are portions of the semiconductor fins that remain after formation of the various transistors and may be formed from the semiconductor substrate that is later removed to form backside interconnect structures. Accordingly, subfins 112 may include the same semiconductor material as the one or more semiconductor regions of the semiconductor devices.

According to some embodiments, a conductive layer 114 extends around a given source or drain region 102. Conductive layer 114 may include any suitably conductive material, such as tungsten or another similar metal. Conductive layer 114 extends around at least one or both sidewalls of source or drain region 102 to provide an enhanced ohmic contact with source or drain region 102. In some embodiments, conductive layer 114 extends downwards through a thickness of dielectric layer 110 to make contact with a backside conductive layer 116. The portion of conductive layer 114 extending through a thickness of dielectric layer 110 may be considered a separate conductive backside contact, although the backside contact and conductive layer 114 may include the same conductive material. A width of the backside contact along the second direction may be wider than a largest width of source or drain region 102.

According to some embodiments, one or more dielectric plugs 118 extend in a third direction (e.g., along the z-axis) to electrically isolate source or drain regions from one another. In the illustrated example, source or drain region 102 is isolated from any other source or drain region due to the presence of one or more dielectric plugs 118. According to some embodiments, one or more dielectric plugs 118 interrupt conductive layer 114 along the second direction and may extend above and/or below a height of conductive layer 114 in the third direction. One or more dielectric plugs 118 may be any suitable dielectric material, such as the same dielectric material as dielectric layer 110.

According to some embodiments, a front side contact 120 may be formed through a top dielectric layer 122 over conductive layer 114. Front side contact 120 may be the same conductive material as conductive layer 114 and may be used to electrically connect source or drain region 102 to one or more front-side interconnect layers. Top dielectric layer 122 may be any suitable dielectric material, such as the same dielectric material as one or more dielectric plugs 118.

Fabrication Methodology

FIGS. 2A-14A and 2B-14B are cross-sectional views that collectively illustrate an example process for forming an integrated circuit configured with a multi-layer spacer structure, in accordance with an embodiment of the present disclosure. FIGS. 2A-14A represent a cross-sectional view taken across plane A-A' as seen in FIG. 1, while FIGS. 2B-14B represent a cross-sectional view taken across plane B-B' as seen in FIG. 1. Each figure shows an example structure that results from the process flow up to that point in time, so the depicted structure evolves as the process flow continues, culminating in the structure shown in FIGS. 14A and 14B, which is similar to the structure shown in FIG. 1. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figure 2A:
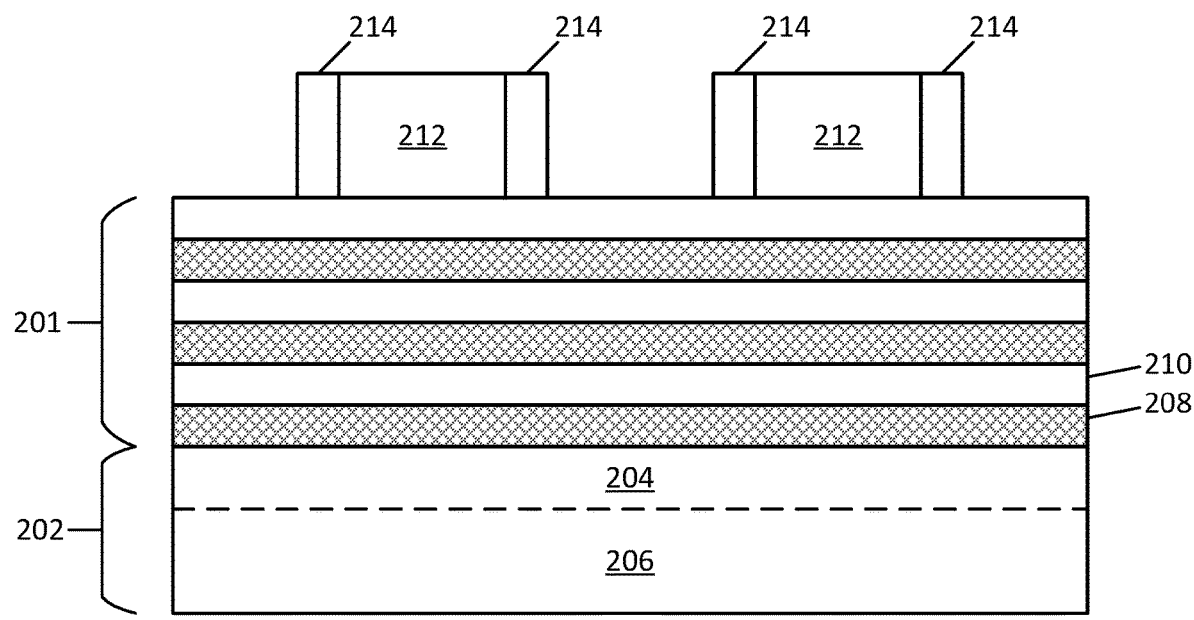
FIGS. 2A and 2B are cross-sectional views that illustrate one stage in an example process for forming an integrated circuit configured with epitaxial regions wrapped by conductive contacts, in accordance with an embodiment of the present disclosure.
Figure 2B:
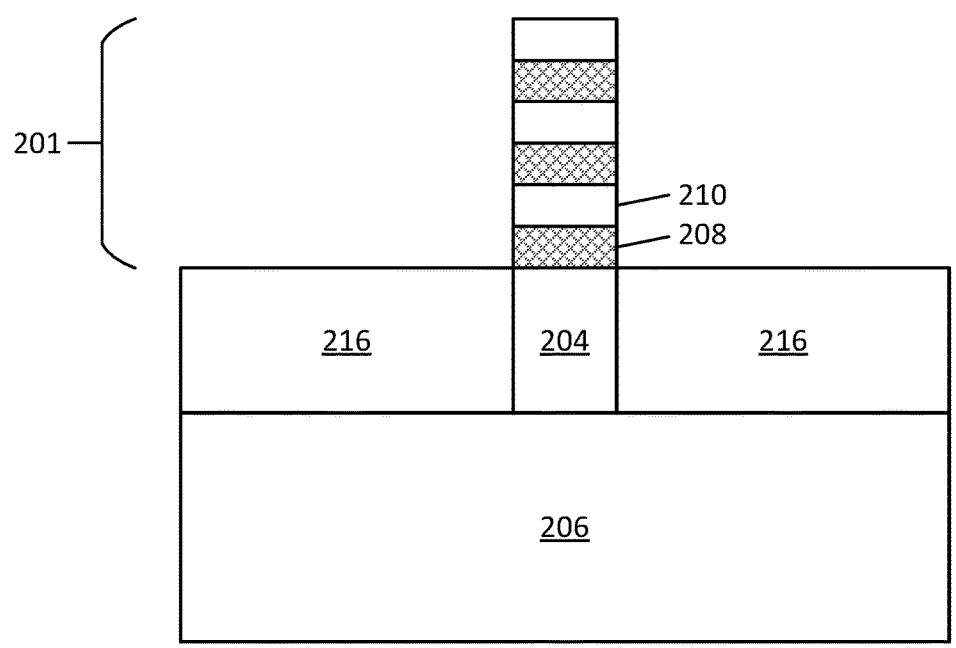

FIGS. 2A and 2B illustrate cross-sectional views taken through and parallel to a fin 201 of one of the semiconductor devices (FIG. 2A) formed over a semiconductor substrate 202 and taken across the area where the source or drain region will be that is perpendicular to a length of fin 201 (FIG. 2B). In this example, fin 201 includes alternating layers of material in order to ultimately form nanowires or nanoribbons in a gate-all-around (GAA) structure. In other examples, fin 201 includes a single semiconductor material (e.g., silicon or germanium).

Substrate 202 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 202 can be a semiconductor-on-insulator substrate having a desired semiconductor layer over a buried insulator layer (e.g., silicon over silicon dioxide). Alternatively, substrate 202 can be a multilayer substrate or superlattice suitable for forming nanowires or nanoribbons (e.g., alternating layers of silicon and SiGe, or alternating layers indium gallium arsenide and indium phosphide). Any number of substrates can be used. Substrate 202 may include a subfin 204 and a bulk region 206 as seen more clearly in FIG. 2B.

In this example, fin 201 includes alternating layers of sacrificial layers 208 and semiconductor layers 210. Semiconductor layers 210 may include silicon, germanium, or an alloy thereof. Sacrificial layers 208 have a different material composition than semiconductor layers 210. In some embodiments, sacrificial layers 208 include some combination of silicon and germanium.

As seen in FIG. 2A, one or more sacrificial gates 212 are patterned over fin 201 and run in an orthogonal direction to a length of fin 201. Sacrificial gate 212 may include any material that can be safely removed later in the process without etching or otherwise damaging the sidewall spacers 214 and/or fin 201. Sidewall spacers 214 may be formed on sidewalls of sacrificial gate 212 and can include any suitable dielectric material, such as silicon nitride. Some portion of sidewall spacers 214 may also develop on the sidewalls of fin 201, according to some embodiments.

As seen in FIG. 2B, fin 201 extends above a dielectric fill 216 that acts as an STI region between adjacent fins (other fins are not shown for clarity). Dielectric fill 216 may include silicon oxide. According to some embodiments, each semiconductor device includes subfin 204 beneath fin 201 and between dielectric fill 216. Subfin 204 may include the same material as bulk region 206 of substrate 202.

While dimensions can vary from one example embodiment to the next, in one example case, the total height of fin 201 (e.g., extending above dielectric fill 216) may be between 50 nm and 150 nm, and the width of fin 201 can be, for example, in the range of 5 to 100 nm. The thickness of each of semiconductor layer 210 and sacrificial layer 208 may be between about 5 nm and about 25 nm.

Figure 3A:
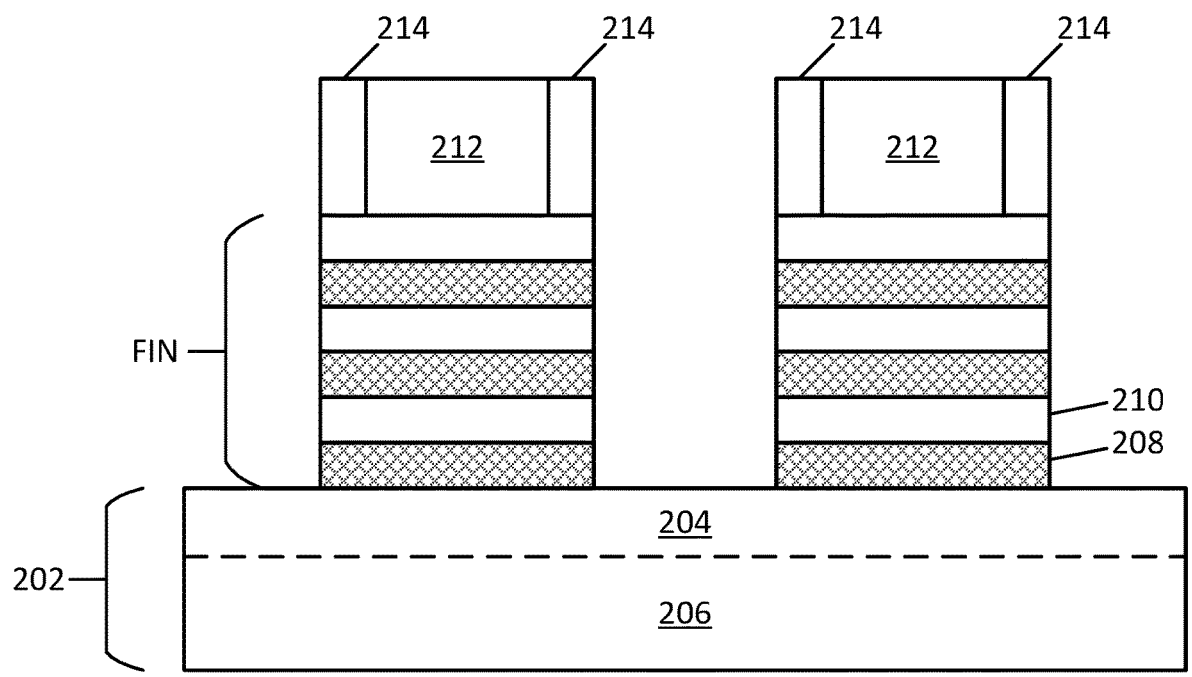
FIGS. 3A and 3B are cross-sectional views that illustrate another stage in the example process for forming an integrated circuit configured with epitaxial regions wrapped by conductive contacts, in accordance with an embodiment of the present disclosure.
Figure 3B:
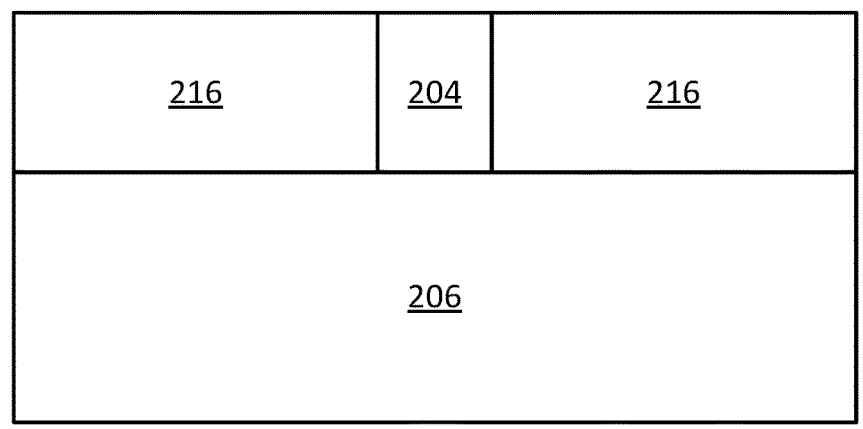

FIGS. 3A and 3B depict the cross-section views of the structure shown in FIGS. 2A and 2B, respectively, following the removal of the exposed fin not under sacrificial gate 212 and sidewall spacers 214. According to some embodiments, both semiconductor layers 210 and sacrificial layers 208 are etched at substantially the same rate using an anisotropic RIE process. As observed in FIG. 3A, the width of sidewalls spacers 214 works to define the length of each fin that defines each semiconductor device. In some embodiments, some undercutting occurs along the edges of the fins beneath sidewall spacers 214 such that the length is not exactly the same as a sum of the widths of sidewall spacers 214 and a width of sacrificial gate 212. As observed in FIG. 3B, the fin is completely removed above subfin 204. In some embodiments, the RIE process may also etch into subfin 204 thus recessing subfin 204 beneath a top surface of dielectric fill 216. Other materials adjacent to or directly on the fin may also be removed, such as portions of sidewall spacers 214, in the view depicted in FIG. 3B.

Figure 4A:
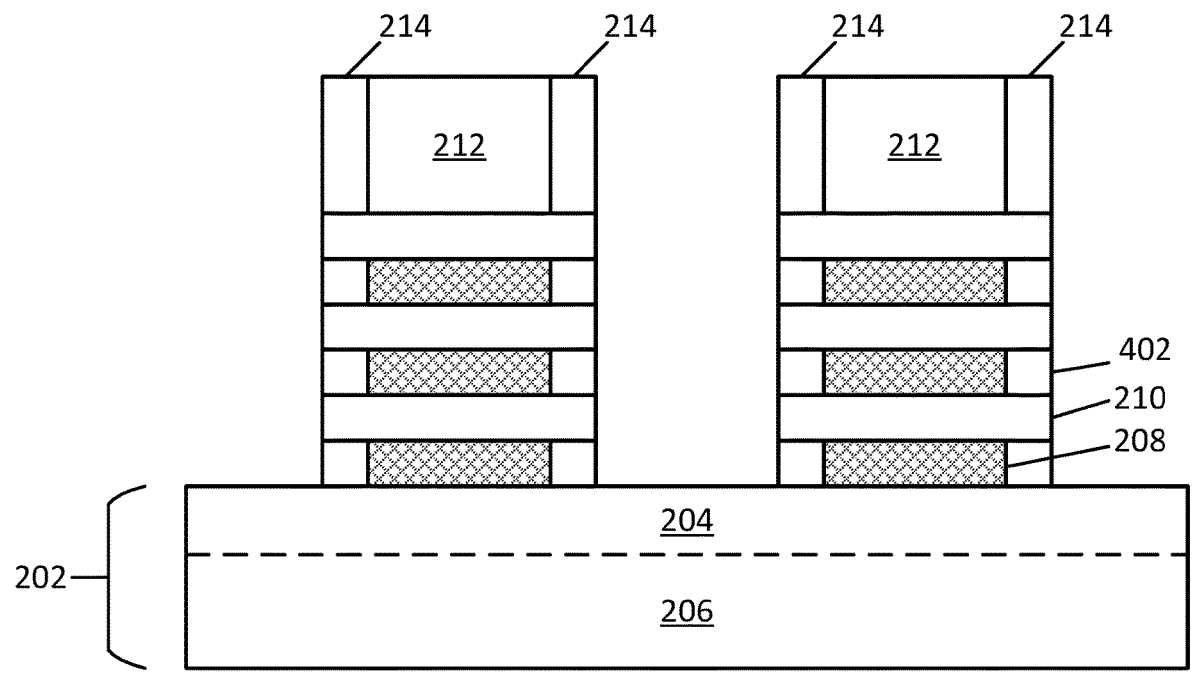
FIGS. 4A and 4B are cross-sectional views that illustrate another stage in the example process for forming an integrated circuit configured with epitaxial regions wrapped by conductive contacts, in accordance with an embodiment of the present disclosure.
Figure 4B:
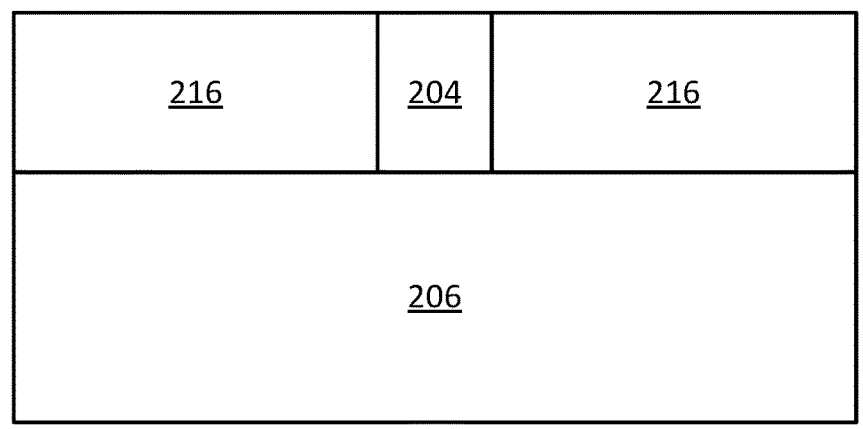

FIGS. 4A and 4B depict the cross-section views of the structure shown in FIGS. 3A and 3B, respectively, following the formation of an additional dielectric layer 402. According to some embodiments, prior to the deposition of dielectric layer 402, the exposed ends of sacrificial layers 208 are laterally recessed using an isotropic etching process that selectively etches sacrificial layers 208 as opposed to semiconductor layers 210. Afterwards, dielectric layer 402 is deposited to effectively fill the dimples between semiconductor layers 210, according to some embodiments. Dielectric layer 402 can then be etched back using RIE or a wet isotropic etch at least until the ends of semiconductor layers 210 are exposed, however, dielectric layer 402 remains around portions of semiconductor layers 210 near its ends.

According to some embodiments, dielectric layer 402 has the same material composition as sidewall spacers 214. It should be noted that this additional dielectric layer 402 may only be present when using a gate-all-around (GAA) structure having semiconductor nanoribbons or nanowires.

Figure 5A:
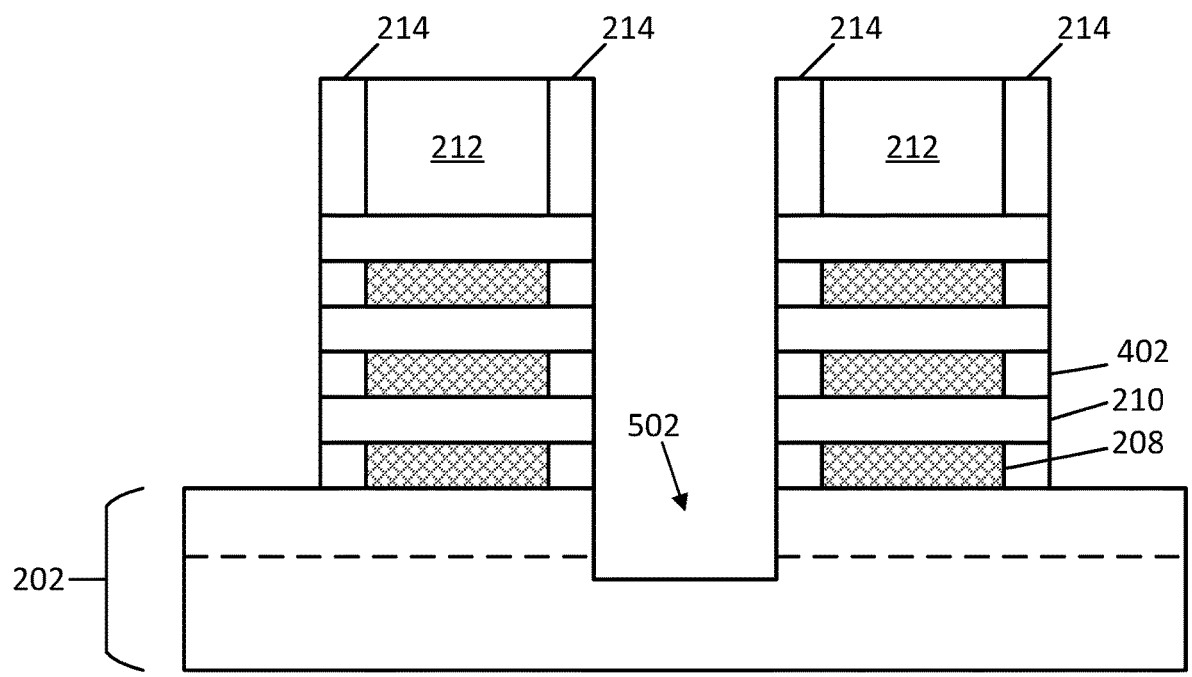
FIGS. 5A and 5B are cross-sectional views that illustrate another stage in the example process for forming an integrated circuit configured with epitaxial regions wrapped by conductive contacts, in accordance with an embodiment of the present disclosure.
Figure 5B:
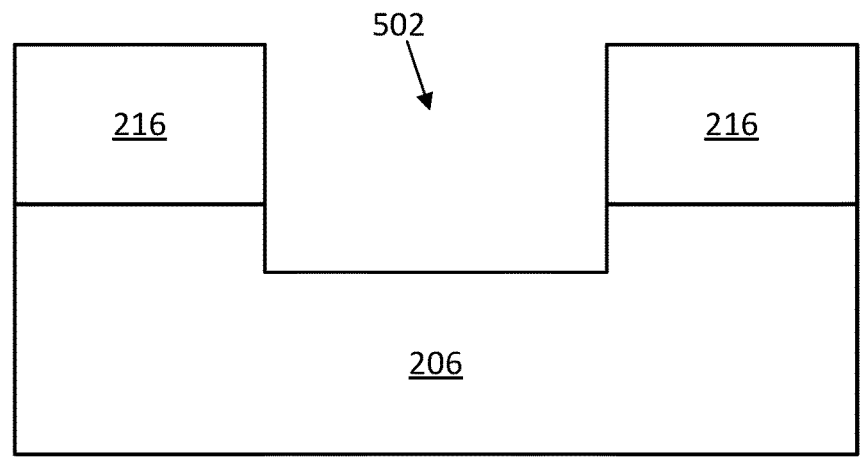

FIGS. 5A and 5B depict the cross-section views of the structure shown in FIGS. 4A and 4B, respectively, following the formation of recess 502 between adjacent fins, according to an embodiment. Recess 502 may be formed using an anisotropic etching process (e.g., RIE) and extend through at least an entire thickness of dielectric fill 216, such that recess 502 extends into bulk region 206 of substrate 202. According to some embodiments, recess 502 has a width along the second direction that is greater than a width of subfin 204 along the second direction. As seen in FIG. 5B, recess 502 completely removes subfin 204 from between the fins. In some other embodiments, recess 502 may be shifted along the second direction such that at least a portion of subfin 204 remains and an inner sidewall of recess 502 includes the at least a portion of subfin 204.

Figure 6A:
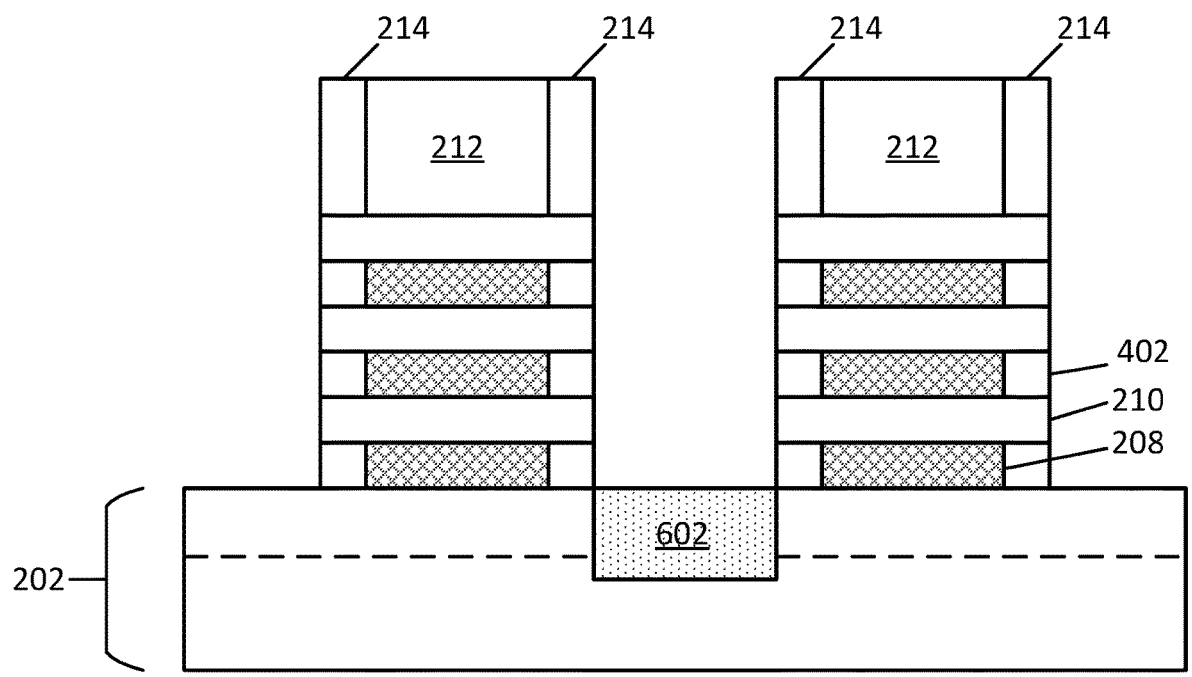
FIGS. 6A and 6B are cross-sectional views that illustrate another stage in the example process for forming an integrated circuit configured with epitaxial regions wrapped by conductive contacts, in accordance with an embodiment of the present disclosure.
Figure 6B:
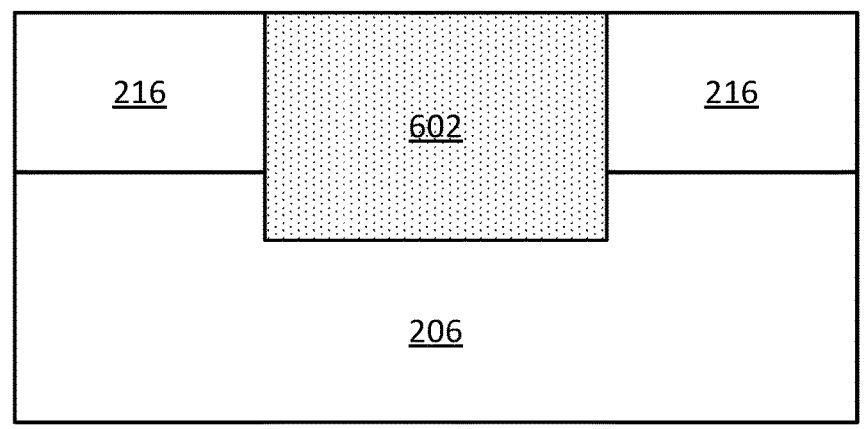

FIGS. 6A and 6B depict the cross-section views of the structure shown in FIGS. 5A and 5B, respectively, following the formation of sacrificial plug 602, according to some embodiments. Sacrificial plug 602 may include any material that has a high degree of etch selectivity with the semiconductor material of substrate 202 and/or dielectric fill 216. In some examples, sacrificial plug 602 includes titanium nitride (TiN) or titanium oxide ($TiO_2$). According to some embodiments, sacrificial plug 602 is recessed to a given thickness such that a top surface of sacrificial plug 602 is beneath a bottom-most semiconductor layer of first semiconductor layers 210.

Figure 7A:
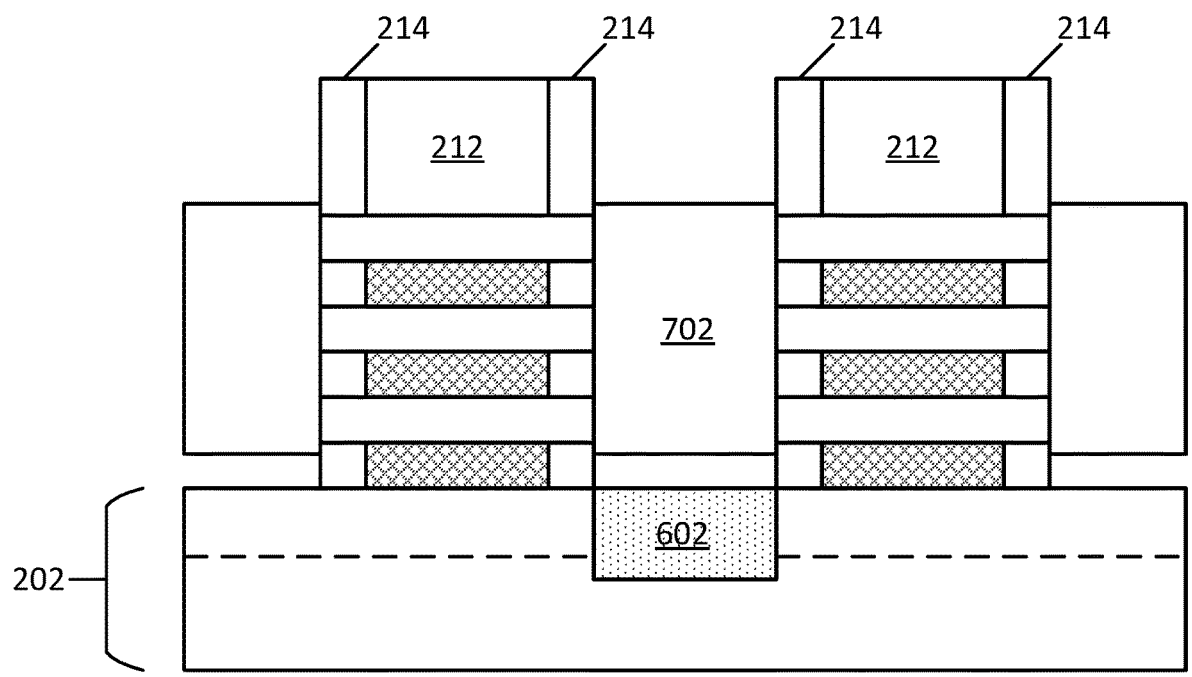
FIGS. 7A and 7B are cross-sectional views that illustrate another stage in the example process for forming an integrated circuit configured with epitaxial regions wrapped by conductive contacts, in accordance with an embodiment of the present disclosure.
Figure 7B:
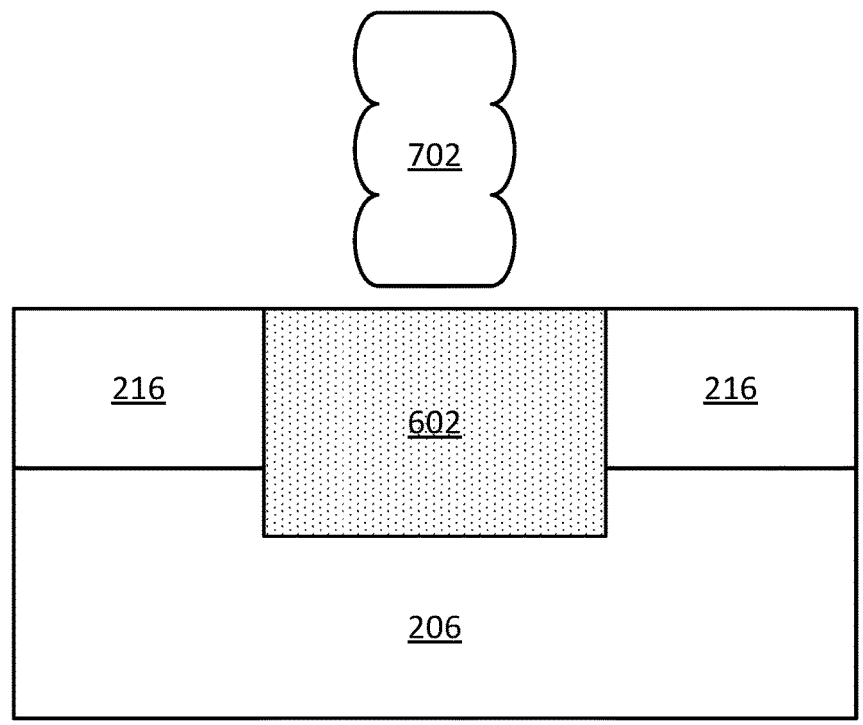

FIGS. 7A and 7B depict the cross-section views of the structure shown in FIGS. 6A and 6B, respectively, following the formation of source or drain region 702 between the fins, according to some embodiments. Source or drain region 702 may be epitaxially grown from the exposed ends of semiconductor layers 210, such that the material grows together or otherwise merges towards the middle of the trench between the fins, according to some embodiments. In other embodiments, the epitaxial growth may only partially merge, or not merge at all thereby leaving space between the laterally adjacent epi-growths in which contact material can be deposited. Such embodiments may further increase contact surface area and thus further lower contact resistance. Further note that epitaxial growth on one semiconductor layer 210 can fully or partially merge with epitaxial growth on one or more other semiconductor layers 210 in the same vertical stack. The degree of any such merging can vary from one embodiment to the next. In the example of a PMOS device, first source or drain region 702 may be a semiconductor material (e.g., group IV or group III-V semiconductor materials) having a higher dopant concentration of p-type dopants compared to n-type dopants. In the example of an NMOS device, first source or drain region 702 may be a semiconductor material (e.g., group IV or group III-V semiconductor materials) having a higher dopant concentration of n-type dopants compared to p-type dopants. As seen in FIG. 7B, a space may exist between the bottom of source or drain region 702 and the top surface of sacrificial plug 602.

Figure 8A:
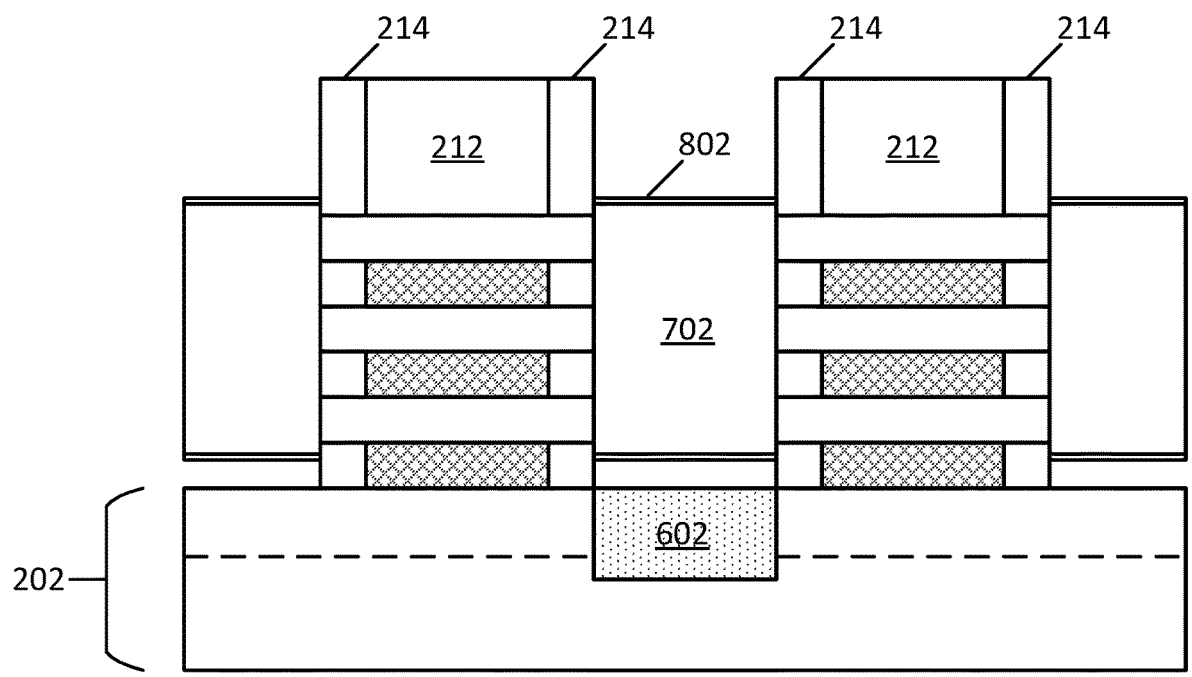
FIGS. 8A and 8B are cross-sectional views that illustrate another stage in the example process for forming an integrated circuit configured with epitaxial regions wrapped by conductive contacts, in accordance with an embodiment of the present disclosure.
Figure 8B:
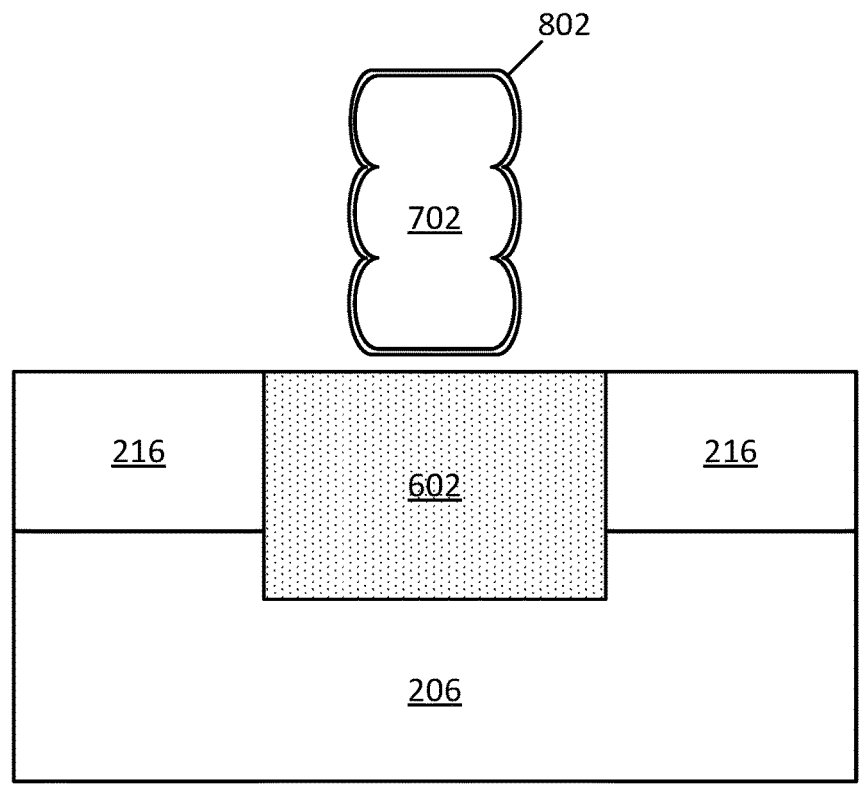

FIGS. 8A and 8B depict the cross-section views of the structure shown in FIGS. 7A and 7B, respectively, following the formation of a highly conductive layer 802 around any exposed surfaces of source or drain region 702, according to some embodiments. Highly conductive layer 802 may be a silicide layer used to lower the contact resistance of source or drain region 702. In some embodiments, highly conductive layer 802 extends around all outer surfaces of source or drain region 702. Highly conductive layer 802 may be epitaxially grown such that it grows only on the exposed semiconductor surfaces of source or drain region 702.

Figure 9A:
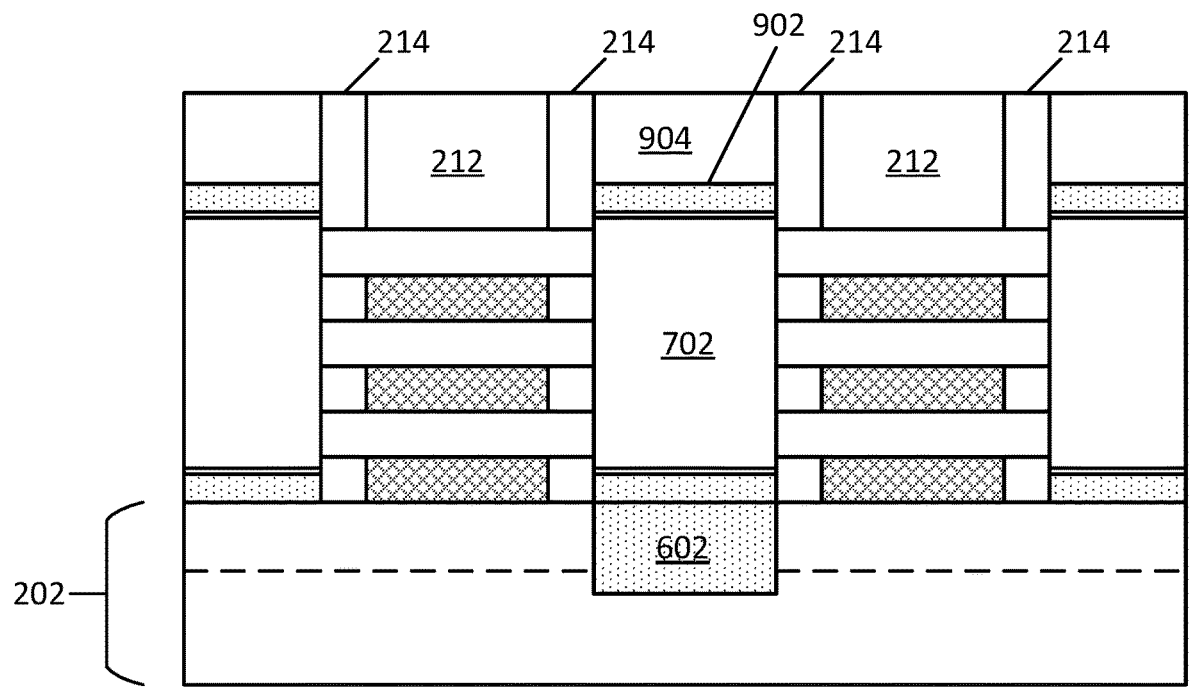
FIGS. 9A and 9B are cross-sectional views that illustrate another stage in the example process for forming an integrated circuit configured with epitaxial regions wrapped by conductive contacts, in accordance with an embodiment of the present disclosure.
Figure 9B:
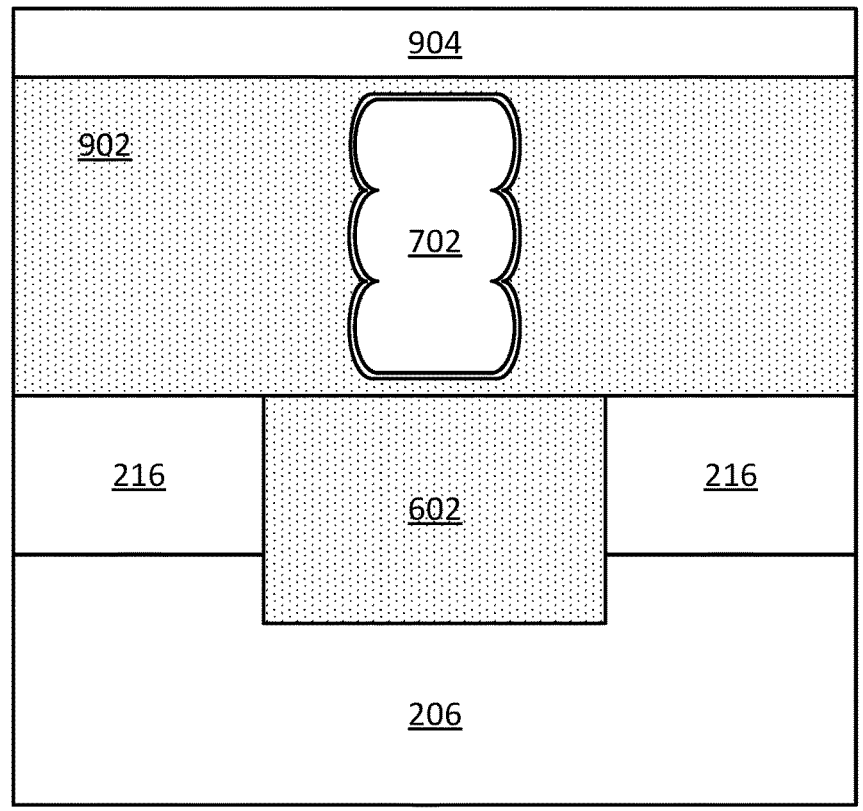

FIGS. 9A and 9B depict the cross-section views of the structure shown in FIGS. 8A and 8B, respectively, following the formation of sacrificial material 902 and a dielectric cap 904, according to some embodiments. Sacrificial material 902 may be the same sacrificial material as sacrificial plug 602, or any other suitable material exhibiting high etch selectivity with any other surrounding dielectric or conductive materials. In some embodiments, sacrificial material 902 includes titanium nitride (TiN) or titanium oxide (TiO$_2$). According to some embodiments, sacrificial material 902 surrounds all surfaces of source or drain region 702 (along with its outer conductive layer 802). In some cases, sacrificial material 902 abuts at least one or more sidewalls of source or drain region 702. Sacrificial material 902 may be deposited using any known technique, such as physical vapor deposition (PVD), chemical vapor deposition (CVD), or plasma enhanced chemical vapor deposition (PECVD).

Dielectric cap 904 may be formed over a top surface of sacrificial material 902. Dielectric cap 904 may be any suitable dielectric material, although in some embodiments, dielectric cap 904 is the same dielectric material as dielectric fill 216. A top surface of dielectric cap 904 may be polishing using, for example, chemical mechanical polishing (CMP) to level the top surface of dielectric cap 904 with a top surface of at least sidewall spacers 214.

Figure 10A:
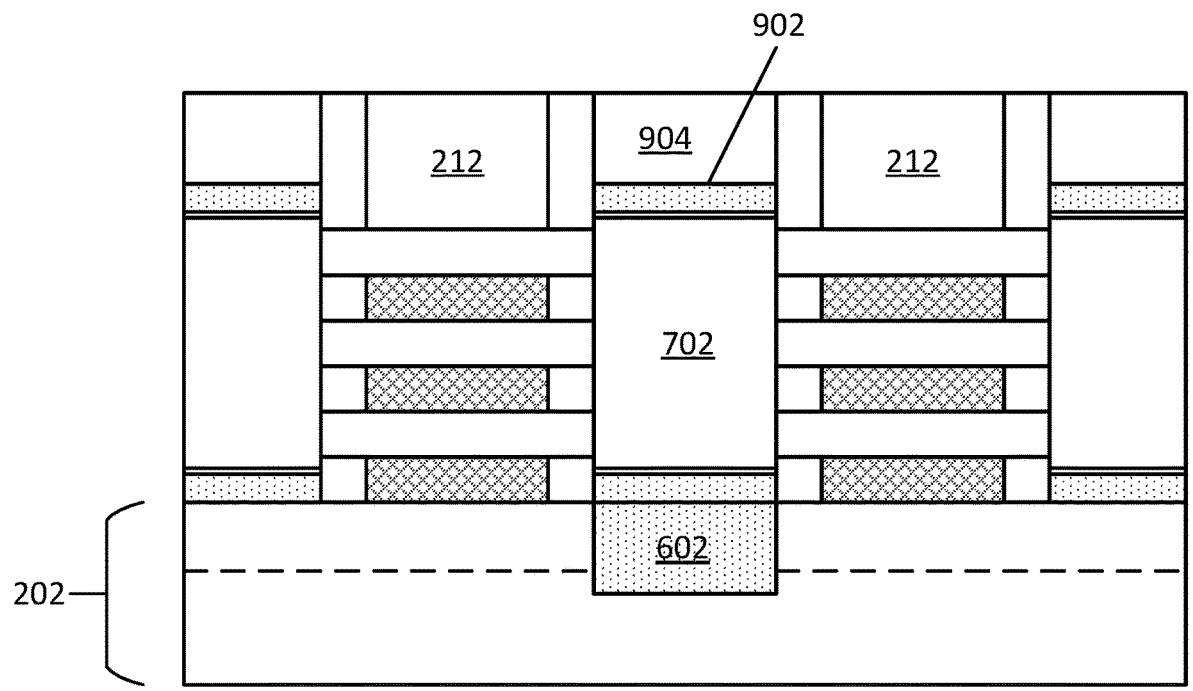
FIGS. 10A and 10B are cross-sectional views that illustrate another stage in the example process for forming an integrated circuit configured with epitaxial regions wrapped by conductive contacts, in accordance with an embodiment of the present disclosure.
Figure 10B:
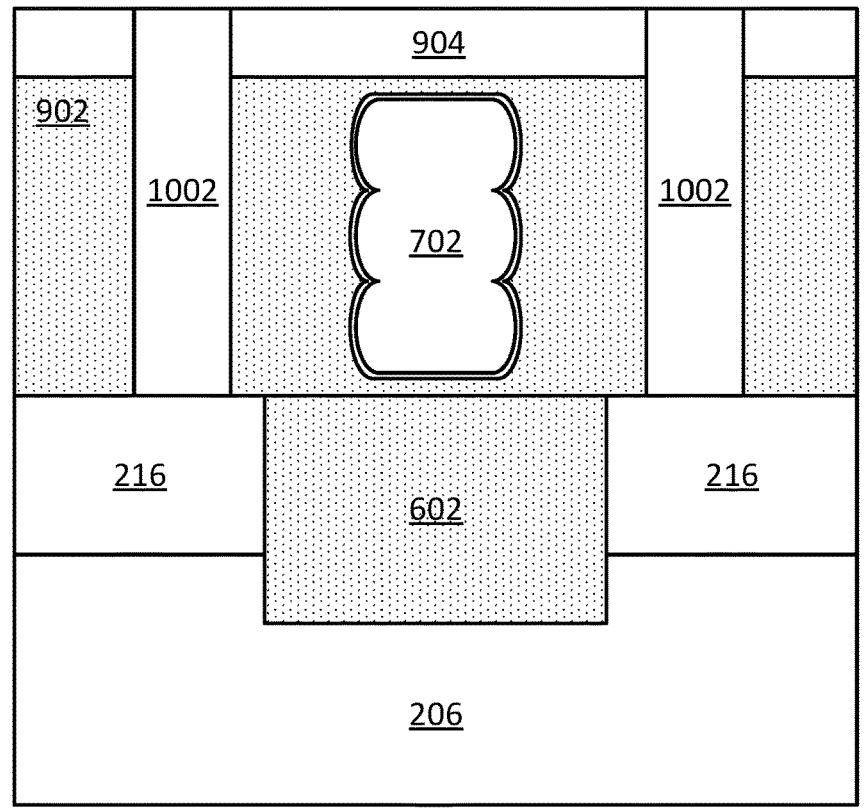

FIGS. 10A and 10B depict the cross-section views of the structure shown in FIGS. 9A and 9B, respectively, following the formation of dielectric plugs 1002, according to some embodiments. Dielectric plugs 1002 extend through an entire thickness of sacrificial material 902 between dielectric cap 904 and dielectric fill 216, according to some embodiments. Accordingly, a bottom surface of each dielectric plug 1002 contacts at least a portion of dielectric fill 216. Dielectric plugs 1002 may be any suitable dielectric material, although in some embodiments, dielectric plugs 1002 are the same dielectric material as both dielectric cap 904 and dielectric fill 216. In one example, each of dielectric plugs 1002, dielectric cap 904, and dielectric fill 216 includes silicon oxide. Dielectric plugs 1002 may be provided to isolate source or drain region 702 from any adjacent source or drain regions and may not be present in situations where adjacent source or drain regions are desired to be electrically coupled together.

Figure 11A:
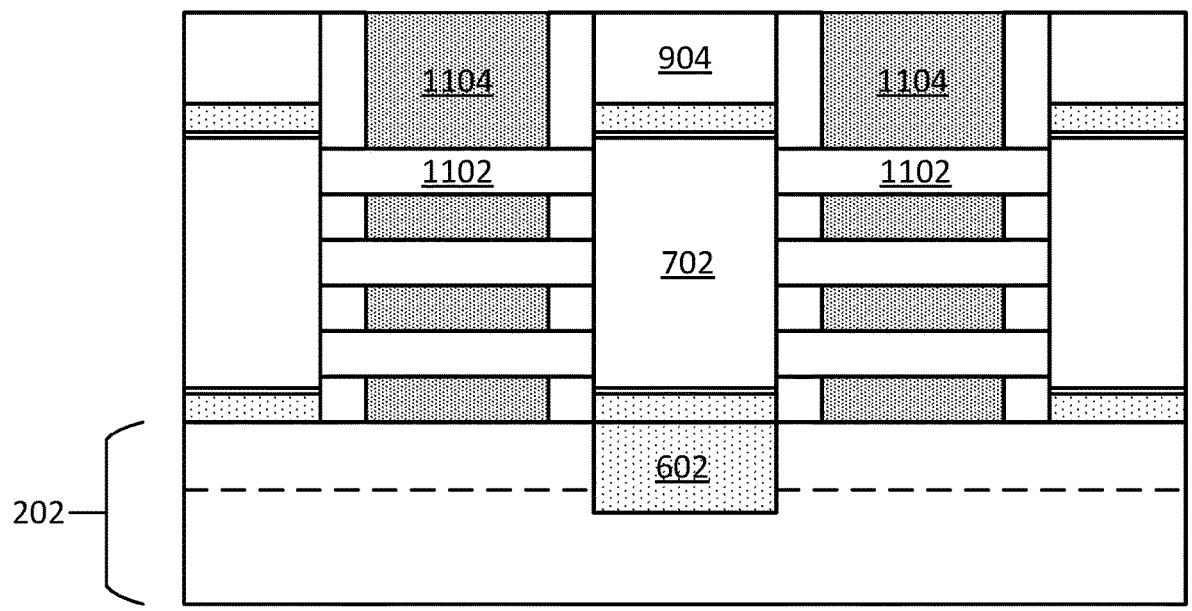
FIGS. 11A and 11B are cross-sectional views that illustrate another stage in the example process for forming an integrated circuit configured with epitaxial regions wrapped by conductive contacts, in accordance with an embodiment of the present disclosure.
Figure 11B:
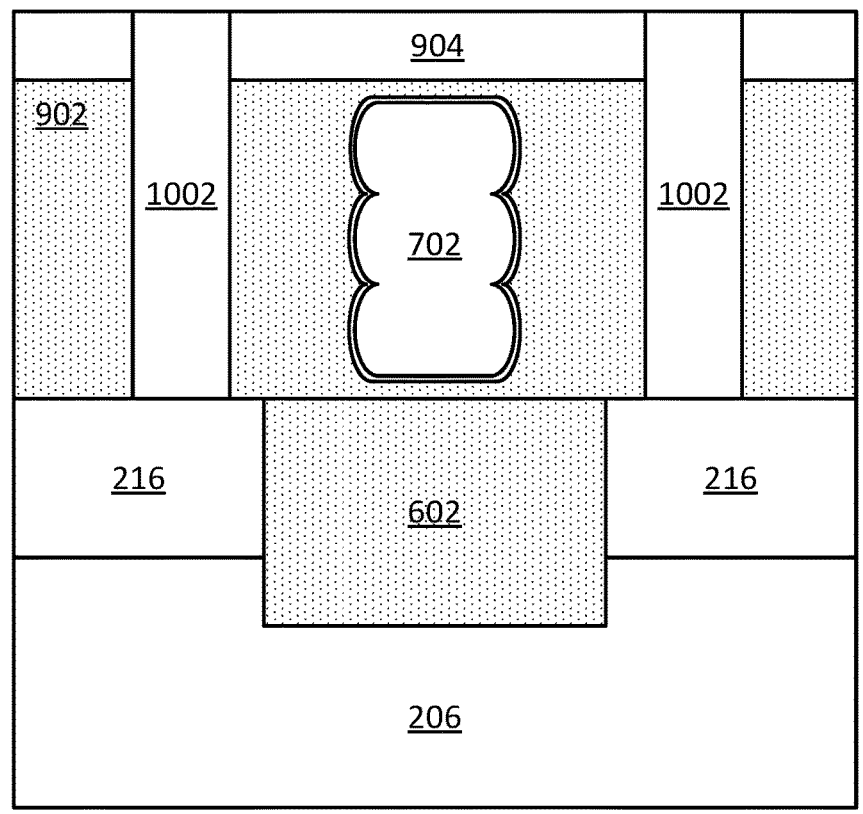

FIGS. 11A and 11B depict the cross-section views of the structure shown in FIGS. 10A and 10B, respectively, following the formation of nanoribbons 1102 and a gate structure 1104 around nanoribbons 1102, according to some embodiments. Depending on the dimensions of the structures, nanoribbons 1102 may also be considered nanowires or nanosheets. Sacrificial gates 212 may be removed using any wet or dry isotropic process thus exposing the alternating layer stack of the fins within the trenches left behind after the removal of sacrificial gates 212. Once sacrificial gates 212 are removed, sacrificial layers 208 may also be removed using a selective isotropic etching process that removes the material of sacrificial layers 208 but does not remove (or removes very little of) semiconductor layers 210. At this point, the suspended (sometimes called released) semiconductor layers 210 form nanoribbons 1102 that extend between source or drain region 702 and another source or drain region on the opposite ends of nanoribbons 1102.

As noted above, gate structure 1104 includes a gate dielectric and a gate electrode. The gate dielectric may be conformally deposited around nanoribbons 1102 using any suitable deposition process, such as atomic layer deposition (ALD). The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on nanoribbons 1102, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-k material can be nitridized to improve its aging resistance.

The gate electrode may be deposited over the gate dielectric and can be any standard or proprietary gate structure that may include any number of gate cuts. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

Figure 12A:
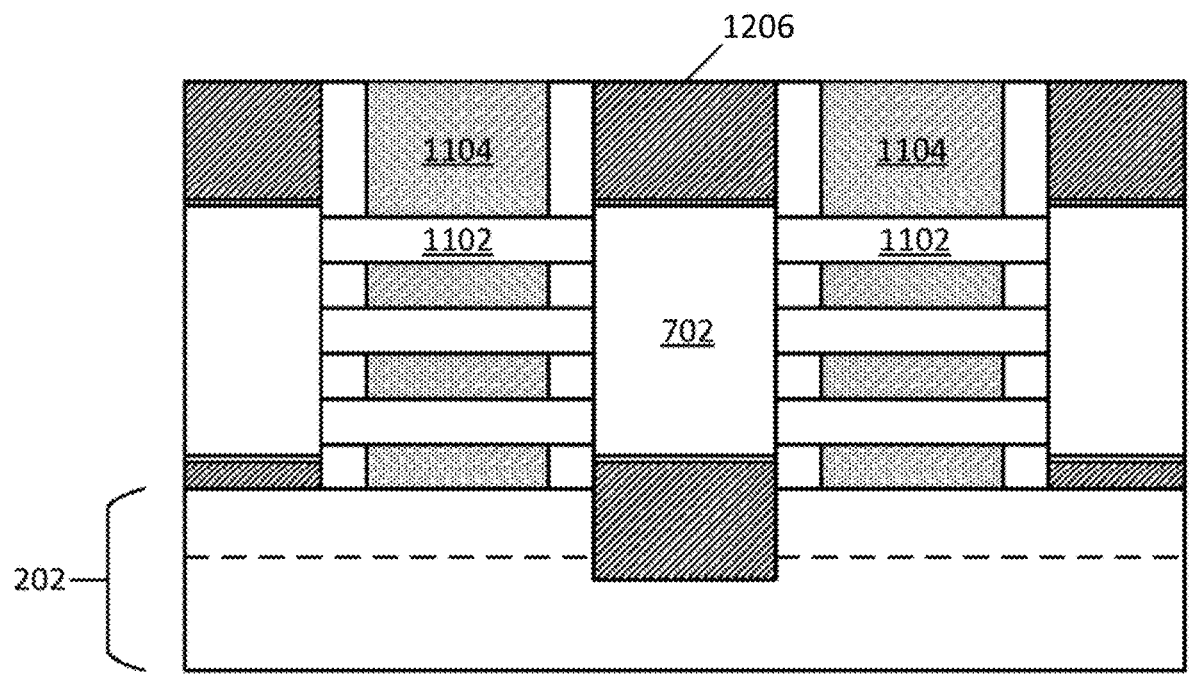
FIGS. 12A and 12B are cross-sectional views that illustrate another stage in the example process for forming an integrated circuit configured with epitaxial regions wrapped by conductive contacts, in accordance with an embodiment of the present disclosure.
Figure 12B:
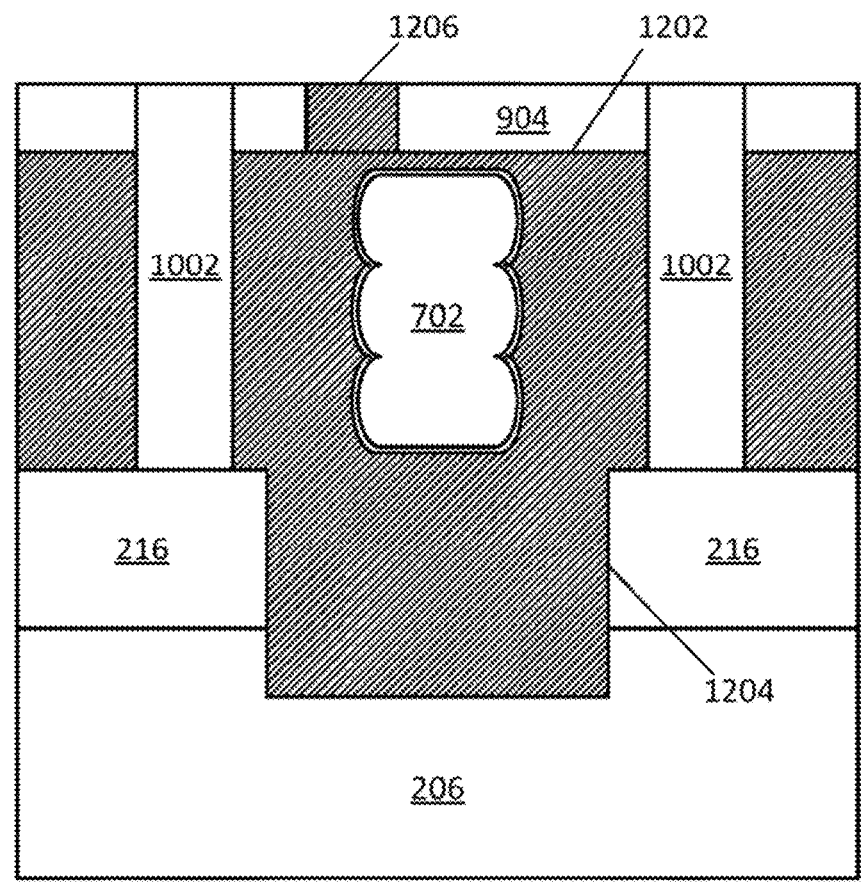

FIGS. 12A and 12B depict the cross-section views of the structure shown in FIGS. 10A and 10B, respectively, following the formation of a conductive layer 1202 and conductive contacts 1204 and 1206, according to some embodiments. Each of conductive layer 1202, first conductive contact 1204, and second conductive contact 1206 may include any suitable conductive material such as tungsten (W). Other conductive materials may include copper (Cu), ruthenium (Ru), cobalt (Co), titanium (Ti), molybdenum (Mo), or any alloys thereof. According to some embodiments, conductive layer 1202 and first conductive contact 1204 replace sacrificial material 902 and sacrificial plug 602, respectively.

Many possible processes may be used to remove sacrificial material 902/sacrificial plug 602 and form conductive layer 1202/first conductive contact 1204. In one example, an opening is formed through dielectric cap 904 and sacrificial material 902/sacrificial plug 602 are removed using an isotropic etching process. In another example, dielectric cap 904 is removed to allow for more exposed area of the sacrificial materials and such materials are removed using an isotropic etching process. In any case, once the sacrificial materials have been removed, both conductive layer 1202 and first conductive contact 1204 may be formed by depositing a suitable conductive material using any deposition process such as CVD or PVD. First conductive contact 1204 may be considered a backside contact as it will make contact with a backside interconnect structure below the semiconductor devices. It should be understood that conductive layer 1202 and first conductive contact 1204 are identified as separate elements, but both elements may be formed together such that no visible seam exists between the two. First conductive contact 1204 may be considered to be the portion of conductive layer 1202 below the top surface of dielectric fill 216. In some embodiments, conductive layer 1202 is formed separately from first conductive contact 1204 such that a seam is visible between the two conductive materials (e.g., visible in an SEM or TEM image).

Second conductive contact 1206 may be formed within an opening through dielectric cap 904, according to some embodiments. Second conductive contact 1206 may be considered a frontside contact that makes contact with a frontside interconnect structure above the semiconductor devices. Accordingly, the illustrated source or drain region 702 includes both a frontside contact and a backside contact, although other examples may only include a backside contact or only include a frontside contact. In any case, conductive layer 1202 wraps completely around source or drain region 702. Conductive layer 1202 may extend in the second direction between source or drain region 702 and adjacent dielectric plugs 1002.

As noted above, first conductive contact 1204 may be shifted along the second direction such that it is not aligned directly beneath source or drain region 702. For example, first conductive contact 1204 may be shifted laterally such that one side of first conductive contact 1204 aligns with a dielectric plug 1002. In another example, first conductive contact 1204 is shifted laterally such that at least a portion of subfin 204 remains and first conductive contact 1204 extends along a sidewall of at least the portion of subfin 204 below source or drain region 702.

Figure 13A:
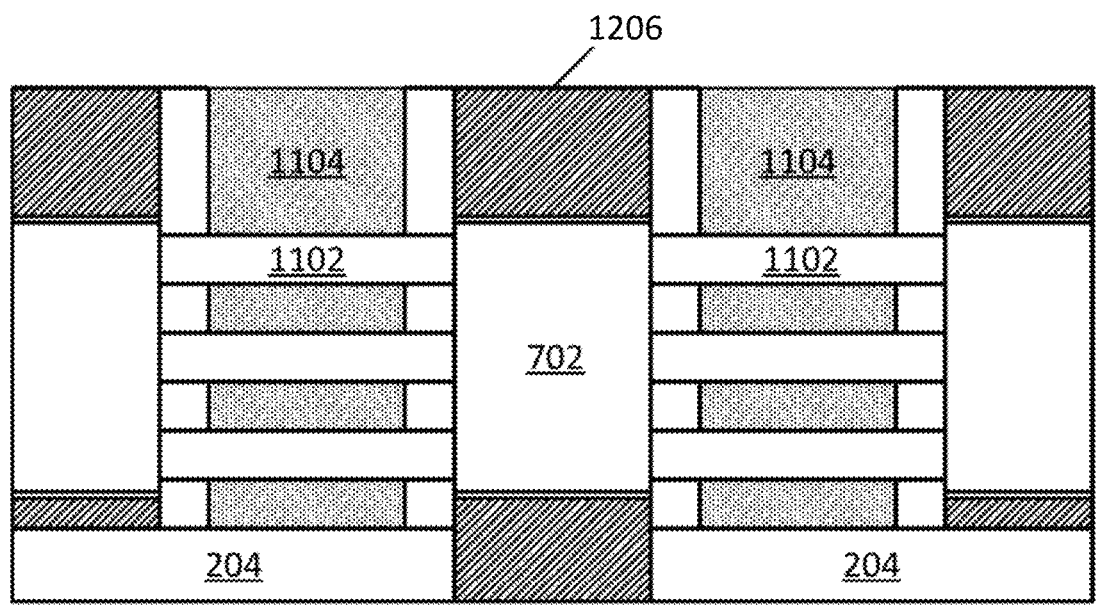
FIGS. 13A and 13B are cross-sectional views that illustrate another stage in the example process for forming an integrated circuit configured with epitaxial regions wrapped by conductive contacts, in accordance with an embodiment of the present disclosure.
Figure 13B:
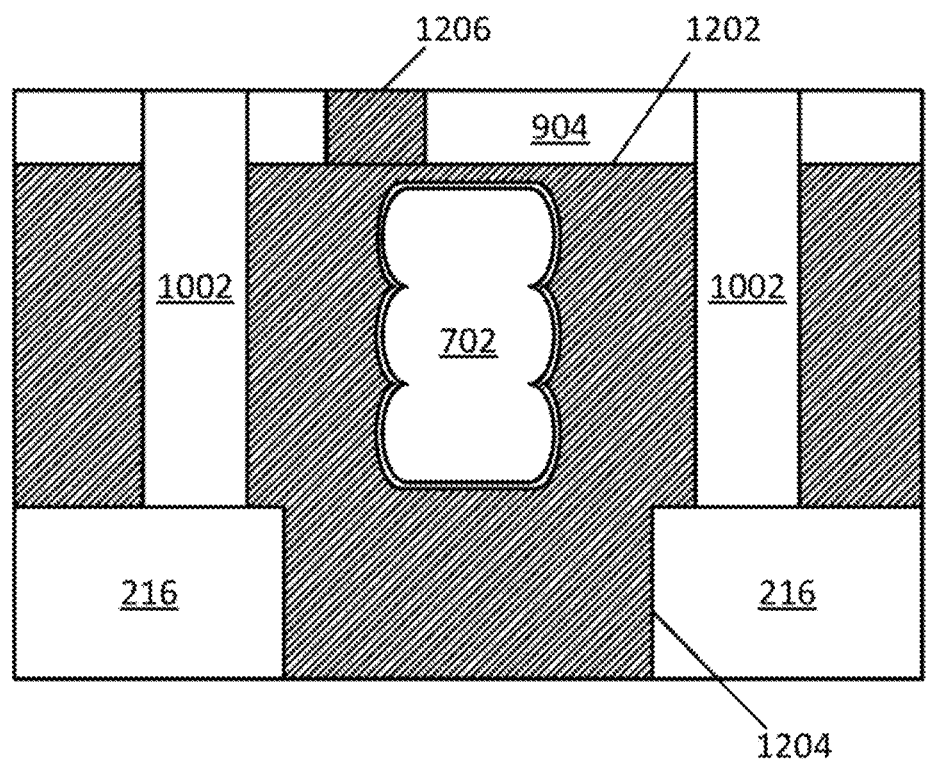

FIGS. 13A and 13B depict the cross-section views of the structure shown in FIGS. 12A and 12B, respectively, following the removal of bulk region 206 of substrate 202, according to some embodiments. Following the formation of various front-side contacts and interconnects (e.g., FEOL structures), bulk region 206 is removed until first conductive contact 1204 is exposed from the backside, according to some embodiments. In some other examples, bulk region 206 is removed until dielectric fill 216 is exposed from the backside. Bulk region 206 may be removed using, for example, CMP and/or vapor phase etchants.

According to some embodiments, once bulk region 206 has been removed, the remaining subfin 204 of substrate 202 coplanar with first conductive contact 1204 is removed using, for example, an isotropic etching process. A dielectric material may then be deposited over and around first conductive contact 1204 and polished back to once again expose first conductive contact 1204 and form a base dielectric layer in place of subfin 204. Any suitable dielectric material may be used for the base dielectric layer, with some examples including silicon oxide, aluminum oxide, or silicon oxycarbonitride.

Figure 14A:
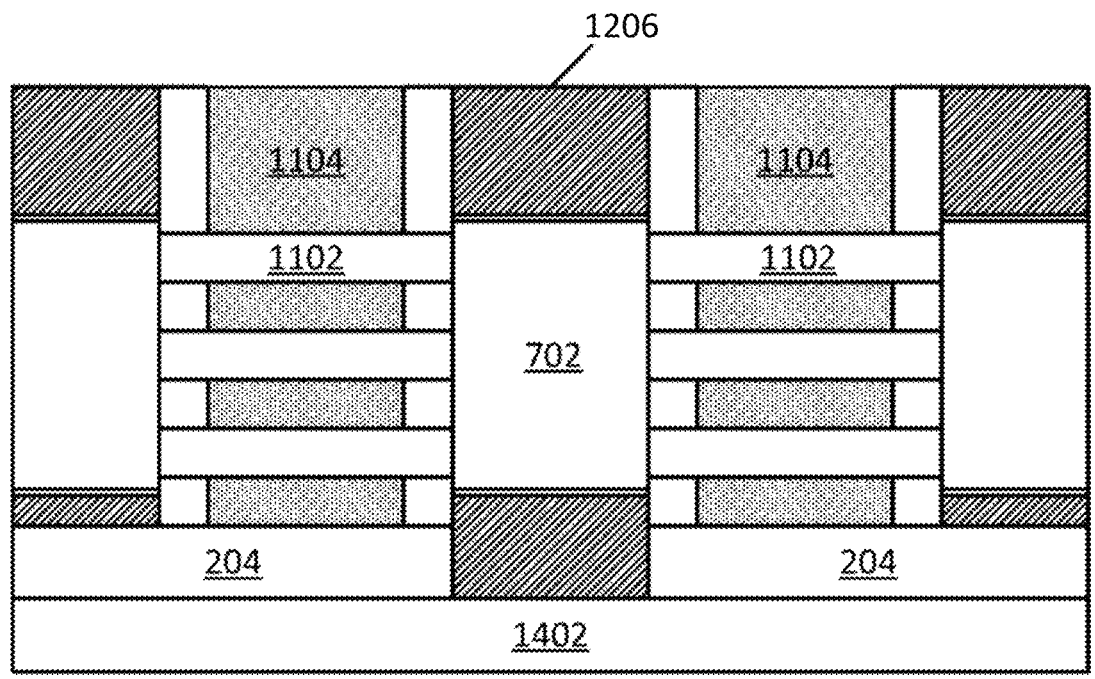
FIGS. 14A and 14B are cross-sectional views that illustrate another stage in the example process for forming an integrated circuit configured with epitaxial regions wrapped by conductive contacts, in accordance with an embodiment of the present disclosure.
Figure 14B:
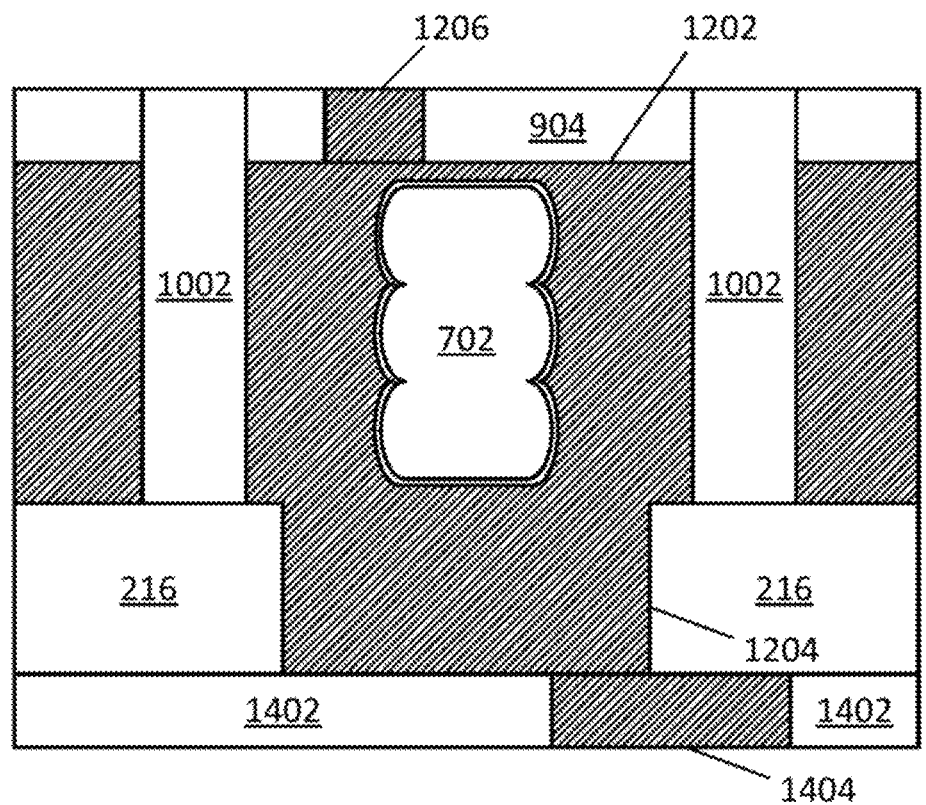

FIGS. 14A and 14B depict the cross-section views of the structure shown in FIGS. 13A and 13B, respectively, following the formation of backside interconnect layer, according to some embodiments. The backside interconnect layer may include a backside dielectric layer 1402 and a backside conductive layer 1404. Backside dielectric layer 1402 may be any suitable dielectric material, such as silicon oxide. Backside conductive layer 1404 may be any suitable conductive material. In some examples, backside conductive layer 1404 includes the same conductive material as first conductive contact 1204. Backside conductive layer 1404 overlaps at least a portion of first conductive contact 1204, according to some embodiments. In some examples, the backside interconnect layer is a first interconnect layer of a plurality of backside interconnect layers formed beneath the semiconductor devices. Since they are formed at different times, a seam may be observable (e.g., within an SEM or TEM image) between backside conductive layer 1404 and first conductive contact 1204.

Figure 15:
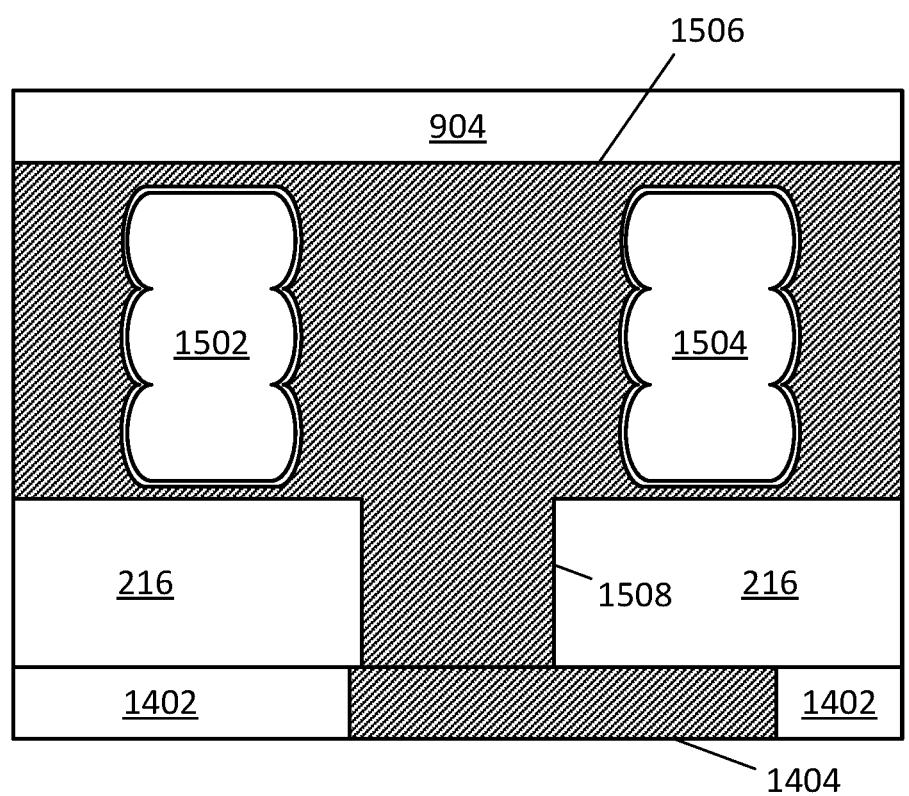
FIG. 15 is a cross-sectional view of another integrated circuit structure that includes epitaxial regions wrapped by conductive contacts, in accordance with an embodiment of the present disclosure.

In some embodiments, first conductive contact 1204 is located between more than one source or drain region. FIG. 15 illustrates another example portion of the integrated circuit having a first source or drain region 1502 and an adjacent second source or drain region 1504 along with a conductive layer 1506 formed between them. A backside contact 1508 may be formed between first source or drain region 1502 and second source or drain region 1504 such that both source or drain regions are electrically coupled to backside contact 1508. One or more frontside contacts may also be formed through dielectric cap 904.

Figure 16:
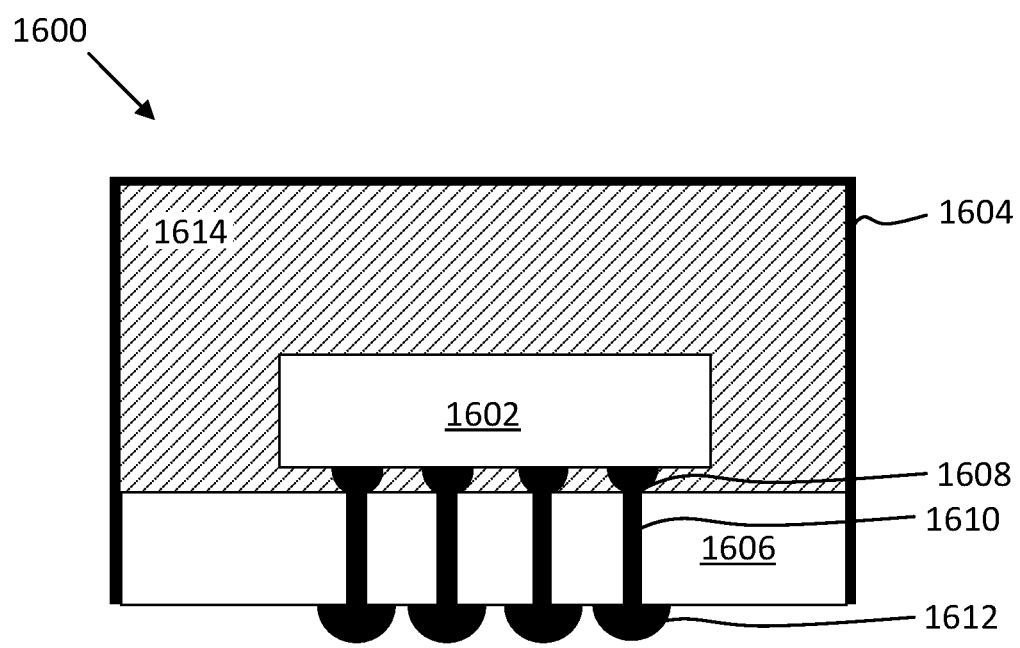
FIG. 16 illustrates a cross-section view of a chip package containing one or more semiconductor dies, in accordance with some embodiments of the present disclosure.

FIG. 16 illustrates an example embodiment of a chip package 1600. As can be seen, chip package 1600 includes one or more dies 1602. One or more dies 1602 may include at least one integrated circuit having semiconductor devices, such as any of the semiconductor devices disclosed herein. One or more dies 1602 may include any other circuitry used to interface with other devices formed on the dies, or other devices connected to chip package 1600, in some example configurations.

As can be further seen, chip package 1600 includes a housing 1604 that is bonded to a package substrate 1606. The housing 1604 may be any standard or proprietary housing, and provides, for example, electromagnetic shielding and environmental protection for the components of chip package 1600. The one or more dies 1602 may be conductively coupled to a package substrate 1606 using connections 1608, which may be implemented with any number of standard or proprietary connection mechanisms, such as solder bumps, ball grid array (BGA), pins, or wire bonds, to name a few examples. Package substrate 1606 may be any standard or proprietary package substrate, but in some cases includes a dielectric material having conductive pathways (e.g., including conductive vias and lines) extending through the dielectric material between the faces of package substrate 1606, or between different locations on each face. In some embodiments, package substrate 1606 may have a thickness less than 1 millimeter (e.g., between 0.1 millimeters and 0.5 millimeters), although any number of package geometries can be used. Additional conductive contacts 1612 may be disposed at an opposite face of package substrate 1606 for conductively contacting, for instance, a printed circuit board (PCB). One or more vias 1610 extend through a thickness of package substrate 1606 to provide conductive pathways between one or more of connections 1608 to one or more of contacts 1612. Vias 1610 are illustrated as single straight columns through package substrate 1606 for ease of illustration, although other configurations can be used (e.g., damascene, dual damascene, through-silicon via). In still other embodiments, vias 1610 are fabricated by multiple smaller stacked vias, or are staggered at different locations across package substrate 1606. In the illustrated embodiment, contacts 1612 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1612, to inhibit shorting.

In some embodiments, a mold material 1614 may be disposed around the one or more dies 1602 included within housing 1604 (e.g., between dies 1602 and package substrate 1606 as an underfill material, as well as between dies 1602 and housing 1604 as an overfill material). Although the dimensions and qualities of the mold material 1614 can vary from one embodiment to the next, in some embodiments, a thickness of mold material 1614 is less than 1 millimeter. Example materials that may be used for mold material 1614 include epoxy mold materials, as suitable. In some cases, the mold material 1614 is thermally conductive, in addition to being electrically insulating.

Methodology

Figure 17:
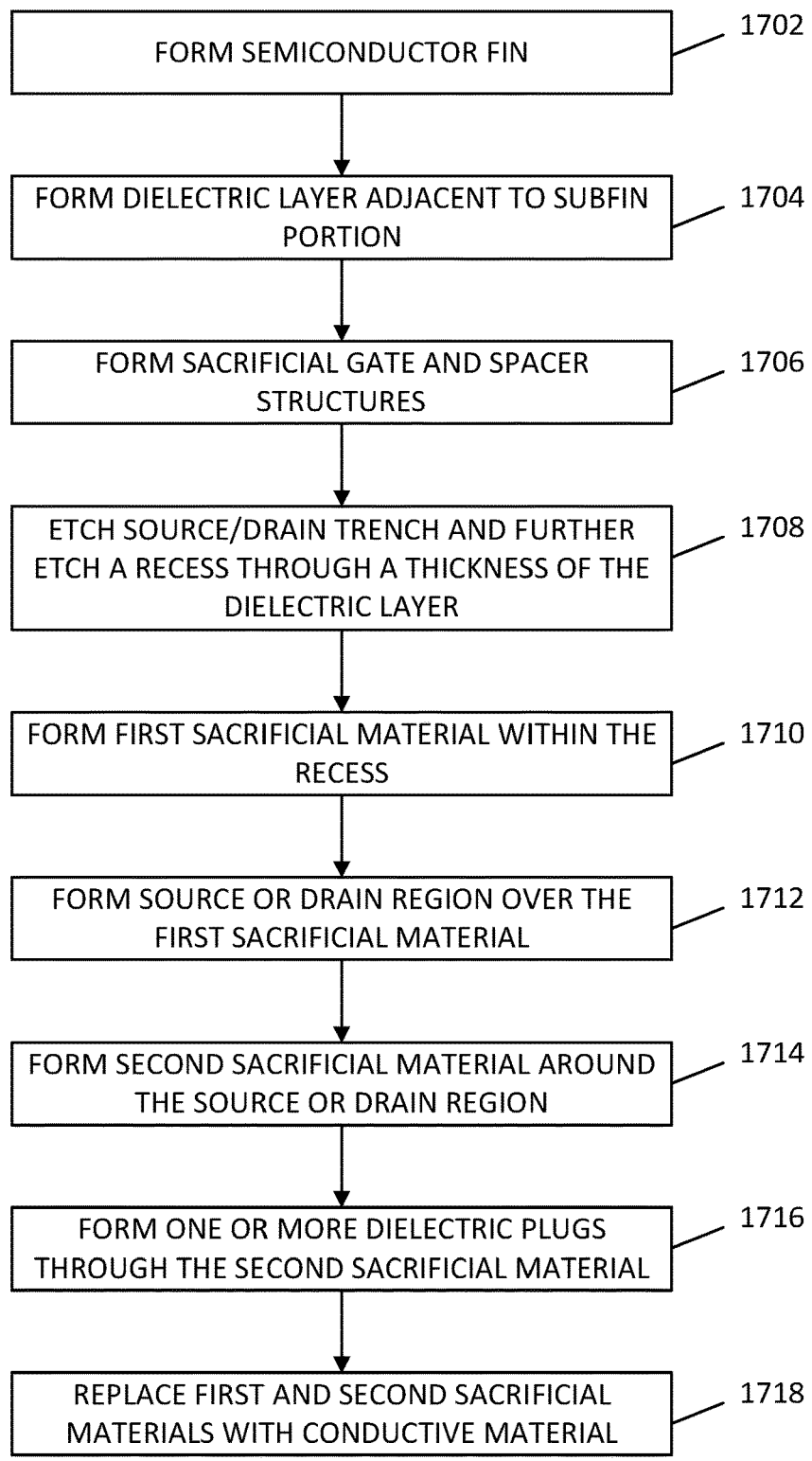
FIG. 17 is a flowchart of a fabrication process for semiconductor device having epitaxial regions wrapped by conductive contacts, in accordance with an embodiment of the present disclosure.

FIG. 17 is a flow chart of a method 1700 for forming at least a portion of an integrated circuit, according to an embodiment. Various operations of method 1700 may be illustrated in FIGS. 2A-14A and 2B-14B. However, the correlation of the various operations of method 1700 to the specific components illustrated in the aforementioned figures is not intended to imply any structural and/or use limitations. Rather, the aforementioned figures provide one example embodiment of method 1700. Other operations may be performed before, during, or after any of the operations of method 1700. Some of the operations of method 1700 may be performed in a different order than the illustrated order.

Method 1700 begins with operation 1702 where at least one semiconductor fin is formed, according to some embodiments. The semiconductor material in the at least one fin may be formed from a substrate such that the fin is an integral part of the substrate (e.g., etched from a bulk silicon substrate). Alternatively, the fin can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around process can then be carried out. Again, the alternating layers can be blanket deposited and then etched into fins, or deposited into fin-shaped trenches.

Method 1700 continues with operation 1704 where a dielectric layer is formed adjacent to a subfin portion of the fin. The dielectric layer may include silicon oxide. According to some embodiments, the dielectric layer acts as an STI region between the fin and any adjacent fins. According to some embodiments, each semiconductor device includes a subfin portion beneath a fin of alternating semiconductor layers and adjacent to the dielectric layer. The subfin may include the same material as a bulk region of the underlying semiconductor substrate.

Method 1700 continues with operation 1706 where sacrificial gates and sidewall spacers are formed over a portion of the fin. The sacrificial gates may include any material that can be safely removed later in the process without etching or otherwise damaging the sidewall spacers and/or the fin. The sacrificial gates may include polysilicon while the sidewall spacers may include silicon nitride. The sidewall spacers are formed on sidewalls of the sacrificial gates and etched back to remove the sidewall spacer material from any horizontal surfaces.

Method 1700 continues with operation 1708 where a source/drain trench is etched through the fin between adjacent sacrificial gates and sidewall spacers. According to some embodiments, a recess is also etched adjacent to the fin through at least a full thickness of the dielectric layer. According to some embodiments, the recess has a width along the length of the source/drain trench that is greater than a width of the subfin. In some examples, the recess completely removes the subfin within the source/drain trench. In some other embodiments, the recess is shifted along the length of the source/drain trench such that at least a portion of the subfin remains and an inner sidewall of the recess includes the at least a portion of the subfin.

Method 1700 continues with operation 1710 where a first sacrificial material is formed within the recess. The first sacrificial material may include any material that has a high degree of etch selectivity with the semiconductor material of the underlying substrate and/or the dielectric layer. In some examples, first sacrificial material includes titanium nitride (TiN) or titanium oxide ($TiO_2$). According to some embodiments, the first sacrificial material is recessed to a given thickness such that a top surface of the first sacrificial material is beneath a top surface of the dielectric layer.

Method 1700 continues with operation 1712 where a source or drain region is formed over the first sacrificial material. The source or drain region may be epitaxially grown from the exposed ends of semiconductor layers from adjacent fins, such that the material grows together towards the middle of the source/drain trench between the fins. In the example of a PMOS device, the source or drain region 702 may be a semiconductor material (e.g., group IV or group III-V semiconductor materials) having a higher dopant concentration of p-type dopants compared to n-type dopants. In the example of an NMOS device, the source or drain region may be a semiconductor material (e.g., group IV or group III-V semiconductor materials) having a higher dopant concentration of n-type dopants compared to p-type dopants. In some examples, a space exists between the bottom of the source or drain region and the top surface of the first sacrificial material.

Method 1700 continues with operation 1714 where a second sacrificial material is formed around the source or drain region. The second sacrificial material may be the same sacrificial material as the first sacrificial material, or any other suitable material exhibiting high etch selectivity with any other surrounding dielectric or conductive materials. In some embodiments, the second sacrificial material includes titanium nitride (TiN) or titanium oxide ($TiO_2$). According to some embodiments, the second sacrificial material surrounds all surfaces of the source or drain region (along with any silicide grown on the source or drain region). In some cases, the second sacrificial material abuts at least one or more sidewalls of the source or drain region.

Method 1700 continues with operation 1716 where one or more dielectric plugs are formed through the second sacrificial material. According to some embodiments the one or more dielectric plugs extend through an entire thickness of the second sacrificial material, such that at least a portion of the bottom surface of the dielectric plugs contacts the dielectric layer. The one or more dielectric plugs may be any suitable dielectric material, although in some embodiments, the one or more dielectric plugs are the same dielectric material as the dielectric layer. In one example, the one or more dielectric plugs and the dielectric layer include silicon oxide. The one or more dielectric plugs may be provided to isolate the source or drain region from any adjacent source or drain regions and may not be present in situations where adjacent source or drain regions are desired to be electrically coupled together.

Method 1700 continues with operation 1718 where the first and second sacrificial materials are replaced with a conductive material. An isotropic etching process may be used to remove the first and second sacrificial materials, leaving space around the source or drain region between one or more dielectric plugs and leaving space beneath the source or drain region (e.g., the area previously occupied by the first sacrificial material). According to some embodiments, a conductive material may be formed within the space left behind after removing the first and second sacrificial materials. Accordingly, the conductive material may be formed completely around the source or drain region, or at least abutting sidewalls of the source or drain region.

The conductive material may include any suitable conductive material such as tungsten (W). Other conductive materials may include copper (Cu), ruthenium (Ru), cobalt (Co), titanium (Ti), molybdenum (Mo), or any alloys thereof. The same conductive material may be used to form both a conductive layer in the region previously occupied by the second sacrificial material around the source or drain region, and to form a conductive contact in the region previously occupied by the first sacrificial material. The conductive material may be depositing using any deposition process such as CVD or PVD. The conductive contact may be considered a backside contact as it will make contact with a backside interconnect structure below the semiconductor devices. It should be understood that different portions of the conductive material (e.g., the conductive layer around the source or drain region and the conductive contact beneath the source or drain region) can be identified as separate elements, but both elements may be formed in the same deposition process that no visible seam exists between the two.

Example System

Figure 18:
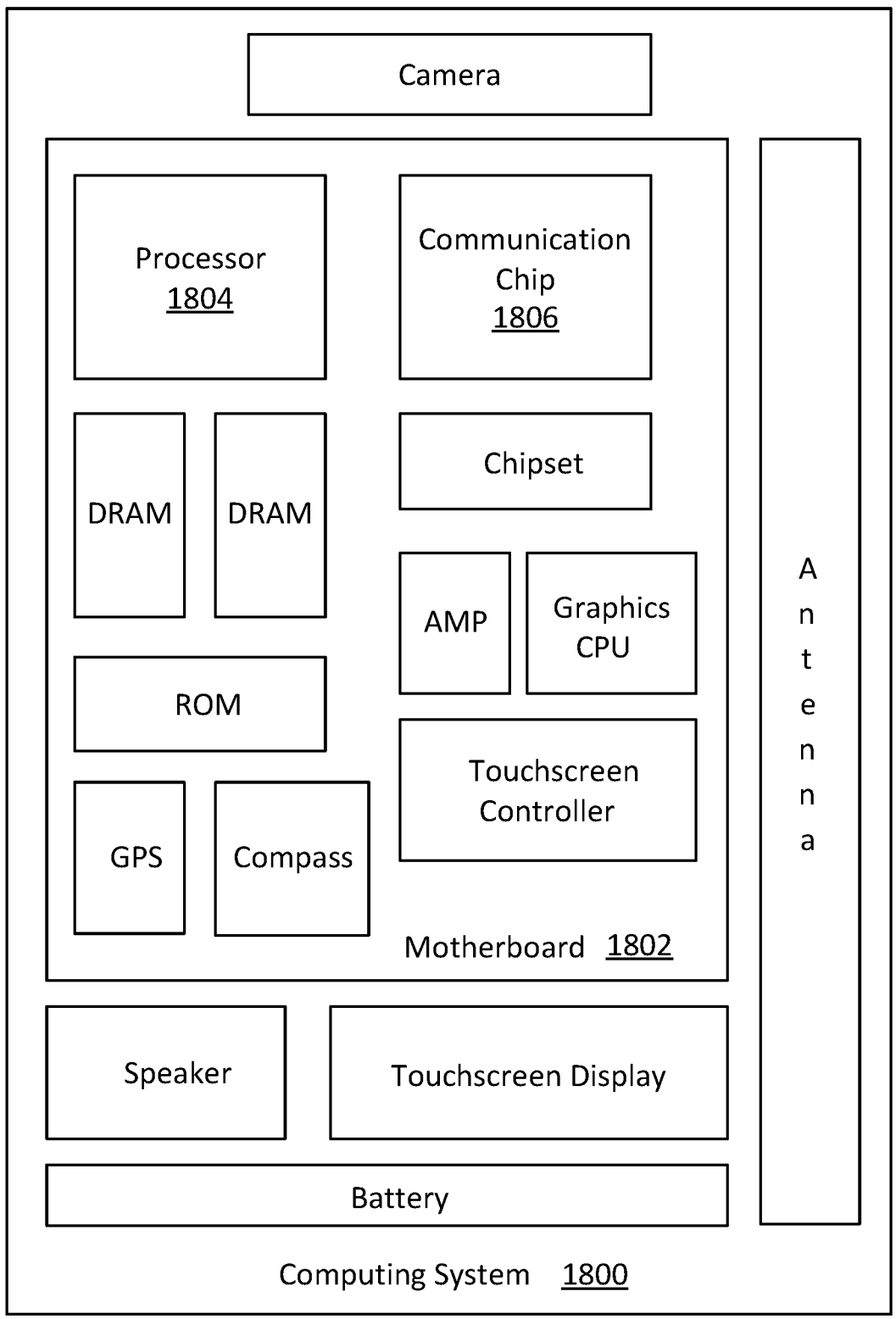
FIG. 18 illustrates a computing system including one or more integrated circuits, as variously described herein, in accordance with an embodiment of the present disclosure.

FIG. 18 is an example computing system implemented with one or more of the integrated circuit structures as disclosed herein, in accordance with some embodiments of the present disclosure. As can be seen, the computing system 1800 houses a motherboard 1802. The motherboard 1802 may include a number of components, including, but not limited to, a processor 1804 and at least one communication chip 1806, each of which can be physically and electrically coupled to the motherboard 1802, or otherwise integrated therein. As will be appreciated, the motherboard 1802 may be, for example, any printed circuit board (PCB), whether a main board, a daughterboard mounted on a main board, or the only board of system 1800, etc.

Depending on its applications, computing system 1800 may include one or more other components that may or may not be physically and electrically coupled to the motherboard 1802. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1800 may include one or more integrated circuit structures or devices configured in accordance with an example embodiment (e.g., a module including an integrated circuit device on a substrate, the substrate having one or more semiconductor devices with source or drain regions with conductive contacts wrapped around the source or drain regions, as variously provided herein). In some embodiments, multiple functions can be integrated into one or more chips (e.g., for instance, note that the communication chip 1806 can be part of or otherwise integrated into the processor 1804).

The communication chip 1806 enables wireless communications for the transfer of data to and from the computing system 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1806 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1800 may include a plurality of communication chips 1806. For instance, a first communication chip 1806 may be dedicated to shorter range wireless communications such as Wi-Fi and Bluetooth and a second communication chip 1806 may be dedicated to longer range wireless communications such as GPS, EDGE, GPRS, CDMA, WiMAX, LTE, Ev-DO, and others.

The processor 1804 of the computing system 1800 includes an integrated circuit die packaged within the processor 1804. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1806 also may include an integrated circuit die packaged within the communication chip 1806. In accordance with some such example embodiments, the integrated circuit die of the communication chip includes one or more semiconductor devices as variously described herein. As will be appreciated in light of this disclosure, note that multi-standard wireless capability may be integrated directly into the processor 1804 (e.g., where functionality of any chips 1806 is integrated into processor 1804, rather than having separate communication chips). Further note that processor 1804 may be a chip set having such wireless capability. In short, any number of processor 1804 and/or communication chips 1806 can be used. Likewise, any one chip or chip set can have multiple functions integrated therein.

In various implementations, the computing system 1800 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1800 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a first semiconductor device having a subfin and one or more first semiconductor bodies extending in a first direction between a first source or drain region and a second source or drain region, and a second semiconductor device having the subfin and one or more second semiconductor bodies extending in the first direction between the first source or drain region and a third source or drain region. The integrated circuit further includes a dielectric layer adjacent to the subfin of the first semiconductor device and the second semiconductor device, a conductive layer that extends completely around the first source or drain region between the one or more first semiconductor bodies and the one or more second semiconductor bodies, and a conductive contact extending through a thickness of the dielectric layer and contacting the conductive layer from below the first source or drain region.

Example 2 includes the subject matter of Example 1, wherein the one or more first semiconductor bodies comprise one or more nanoribbons, nanowires or nanosheets, and the one or more second semiconductor bodies comprise one or more nanoribbons, nanowires or nanosheets.

Example 3 includes the subject matter of Example 1 or 2, wherein the one or more first semiconductor bodies and the one or more second semiconductor bodies comprise germanium, silicon, or any combination thereof.

Example 4 includes the subject matter of any one of Examples 1-3, wherein the conductive contact further contacts a backside conductive layer below the first source or drain region.

Example 5 includes the subject matter of any one of Examples 1-4, further comprising a silicide layer around an outer surface of the first source or drain region.

Example 6 includes the subject matter of Example 5, wherein the silicide layer is directly between the first source or drain region and the conductive layer.

Example 7 includes the subject matter of any one of Examples 1-6, wherein the conductive contact extends along a sidewall of at least a portion of the subfin below the first source or drain region.

Example 8 includes the subject matter of any one of Examples 1-7, wherein the conductive contact is a first conductive contact and the integrated circuit further comprises a second conductive contact that contacts the conductive layer from above the first source or drain region.

Example 9 includes the subject matter of any one of Examples 1-8, wherein the one or more first semiconductor bodies and the one or more second semiconductor bodies extend in a first direction, and wherein the conductive layer extends in a second direction between the first source or drain region and a dielectric plug, the second direction being orthogonal to the first direction.

Example 10 includes the subject matter of any one of Examples 1-9, wherein the conductive layer comprises tungsten.

Example 11 is a printed circuit board comprising the integrated circuit of any one of Examples 1-10.

Example 12 is an electronic device that includes a chip package having one or more dies. At least one of the one or more dies includes a first semiconductor device having a subfin and one or more first semiconductor bodies extending in a first direction between a first source or drain region and a second source or drain region, and a second semiconductor device having the subfin and one or more second semiconductor bodies extending in the first direction between the first source or drain region and a third source or drain region. The integrated circuit further includes a dielectric layer adjacent to the subfin of the first semiconductor device and the second semiconductor device, a conductive layer that extends completely around the first source or drain region between the one or more first semiconductor bodies and the one or more second semiconductor bodies, and a conductive contact extending through a thickness of the dielectric layer and contacting the conductive layer from below the first source or drain region.

Example 13 includes the subject matter of Example 12, wherein the one or more first semiconductor nanoribbons and the one or more second semiconductor nanoribbons comprise germanium, silicon, or any combination thereof.

Example 14 includes the subject matter of Example 12 or 13, wherein the conductive contact further contacts a backside conductive layer below the first source or drain region.

Example 15 includes the subject matter of any one of Examples 12-14, wherein the at least one of the one or more dies further comprises a silicide layer around an outer surface of the first source or drain region.

Example 16 includes the subject matter of Example 15, wherein the silicide layer is directly between the first source or drain region and the conductive layer.

Example 17 includes the subject matter of any one of Examples 12-16, wherein the conductive contact extends along a sidewall of at least a portion of the subfin below the first source or drain region.

Example 18 includes the subject matter of any one of Examples 12-17, wherein the conductive contact is a first conductive contact and the at least one of the one or more dies further comprises a second conductive contact that contacts the conductive layer from above the first source or drain region.

Example 19 includes the subject matter of any one of Examples 12-18, wherein the one or more first semiconductor nanoribbons and the one or more second semiconductor nanoribbons extend in a first direction, wherein the conductive layer extends in a second direction between the first source or drain region and a dielectric plug, the second direction being orthogonal to the first direction.

Example 20 includes the subject matter of any one of Examples 12-19, wherein the conductive layer comprises tungsten Example 21 includes the subject matter of any one of Examples 12-20, further comprising a printed circuit board, wherein the chip package is attached to the printed circuit board.

Example 22 is a method of forming an integrated circuit. The method includes forming a multilayer fin extending in a first direction over a substrate having a first section with first material layers alternating with second material layers, and a subfin section beneath the first section; forming a dielectric layer adjacent to the subfin section; forming a sacrificial gate and spacers on sidewalls of the sacrificial gate, the sacrificial gate extending in a second direction over the multilayer fin, the second direction being different from the first direction; removing an exposed portion of the multilayer fin adjacent to the sacrificial gate and etching a recess through a thickness of the dielectric layer; forming a first sacrificial material within the recess; forming a source or drain region over the sacrificial material and coupled to ends of the second material layers; forming a second sacrificial material completely around the source or drain region; forming one or more dielectric plugs through the second sacrificial material; and replacing the first sacrificial material and the second sacrificial material with a conductive material.

Example 23 includes the subject matter of Example 22, wherein the first material layers comprise silicon and germanium and the second material layers comprise silicon.

Example 24 includes the subject matter of Example 22 or 23, wherein the first sacrificial material and the second sacrificial material are the same material.

Example 25 includes the subject matter of Example 24, wherein the first sacrificial material and the second sacrificial material each comprises titanium and nitrogen.

Example 26 includes the subject matter of any one of Examples 22-25, further comprising removing a bulk portion of the substrate from a backside of the substrate such that the conductive material is exposed from the backside; and forming one or more backside conductive layers coupled to the conductive material.

Example 27 includes the subject matter of any one of Examples 22-26, further comprising forming a front-side conductive contact that contacts the conductive material from above the source or drain region.

Example 28 is an integrated circuit that includes a first semiconductor device having one or more first semiconductor bodies extending between a first source or drain region and a second source or drain region, a second semiconductor device having one or more second semiconductor bodies extending between the first source or drain region and a third source or drain region, and a conductive layer that extends completely around the first source or drain region between the one or more first semiconductor bodies and the one or more second semiconductor bodies.

Example 29 includes the subject matter of Example 28, further comprising a dielectric layer adjacent to a subfin of the first semiconductor device and the second semiconductor device.

Example 30 includes the subject matter of Example 29, further comprising a conductive contact extending through a thickness of the dielectric layer and contacting the conductive layer from below the first source or drain region.

Example 31 includes the subject matter of any one of Examples 28-30, wherein the one or more first semiconductor bodies comprises one or more first nanoribbons and the one or more second semiconductor bodies comprises one or more second nanoribbons.

Example 32 includes the subject matter of any one of Examples 28-31, wherein the one or more first semiconductor bodies is a first fin, and the one or more second semiconductor bodies is a second fin.

Example 33 includes the subject matter of any one of Examples 28-32, further comprising a silicide layer around an outer surface of the first source or drain region.

Example 34 includes the subject matter of Example 33, wherein the silicide layer is directly between the first source or drain region and the conductive layer.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
    a first semiconductor device having a subfin and one or more first semiconductor bodies extending between a first source or drain region and a second source or drain region;
    a second semiconductor device having the subfin and one or more second semiconductor bodies extending between the first source or drain region and a third source or drain region;
    a dielectric layer adjacent to the subfin of the first semiconductor device and the second semiconductor device;
    a conductive layer that extends completely around the first source or drain region between the one or more first semiconductor bodies and the one or more second semiconductor bodies; and
    a conductive contact extending through a thickness of the dielectric layer and contacting the conductive layer from below the first source or drain region.

2. The integrated circuit of claim 1, wherein the one or more first semiconductor bodies comprise one or more nanoribbons, nanowires or nanosheets, and the one or more second semiconductor bodies comprise one or more nanoribbons, nanowires or nanosheets.

3. The integrated circuit of claim 1, wherein the conductive contact further contacts a backside conductive layer below the first source or drain region.

4. The integrated circuit of claim 1, further comprising a silicide layer directly between the first source or drain region and the conductive layer.

5. The integrated circuit of claim 1, wherein the conductive contact extends along a sidewall of at least a portion of the subfin below the first source or drain region.

6. The integrated circuit of claim 1, wherein the conductive contact is a first conductive contact and the integrated circuit further comprises a second conductive contact that contacts the conductive layer from above the first source or drain region.

7. The integrated circuit of claim 1, wherein the one or more first semiconductor bodies and the one or more second semiconductor bodies extend in a first direction, and wherein the conductive layer extends in a second direction between the first source or drain region and a dielectric plug, the second direction being orthogonal to the first direction.

8. The integrated circuit of claim 1, wherein the conductive layer comprises tungsten.

9. A printed circuit board comprising the integrated circuit of claim 1.

10. An electronic device, comprising:
    a chip package comprising one or more dies, at least one of the one or more dies comprising
        a first semiconductor device having a subfin and one or more first semiconductor nanoribbons extending between a first source or drain region and a second source or drain region;

a second semiconductor device having the subfin and one or more second semiconductor nanoribbons extending between the first source or drain region and a third source or drain region;

a dielectric layer adjacent to the subfin of the first semiconductor device and the second semiconductor device;

a conductive layer that extends completely around the first source or drain region between the one or more first semiconductor nanoribbons and the one or more second semiconductor nanoribbons; and a conductive contact extending through a thickness of the dielectric layer and contacting the conductive layer from below the first source or drain region.

11. The electronic device of claim 10, wherein the conductive contact further contacts a backside conductive layer below the first source or drain region.

12. The electronic device of claim 10, wherein the at least one of the one or more dies further comprises a silicide layer directly between the first source or drain region and the conductive layer.

13. The electronic device of claim 10, wherein the conductive contact extends along a sidewall of at least a portion of the subfin below the first source or drain region.

14. The electronic device of claim 10, wherein the conductive contact is a first conductive contact and the at least one of the one or more dies further comprises a second conductive contact that contacts the conductive layer from above the first source or drain region.

15. The electronic device of claim 10, wherein the one or more first semiconductor nanoribbons and the one or more second semiconductor nanoribbons extend in a first direction, wherein the conductive layer extends in a second direction between the first source or drain region and a dielectric plug, the second direction being orthogonal to the first direction.

16. An integrated circuit comprising:

a first semiconductor device having one or more first semiconductor bodies extending between a first source or drain region and a second source or drain region;

a second semiconductor device having one or more second semiconductor bodies extending between the first source or drain region and a third source or drain region; and a conductive layer that extends completely around the first source or drain region between the one or more first semiconductor bodies and the one or more second semiconductor bodies.

17. The integrated circuit of claim 16, further comprising a dielectric layer adjacent to a subfin of the first semiconductor device and the second semiconductor device.

18. The integrated circuit of claim 17, further comprising a conductive contact extending through a thickness of the dielectric layer and contacting the conductive layer from below the first source or drain region.

19. The integrated circuit of claim 16, wherein the one or more first semiconductor bodies comprises one or more first nanoribbons and the one or more second semiconductor bodies comprises one or more second nanoribbons.

20. The integrated circuit of claim 16, further comprising a silicide layer directly between the first source or drain region and the conductive layer.

* * * * *